(12) United States Patent
Matsumoto

(10) Patent No.: US 8,805,665 B2
(45) Date of Patent: Aug. 12, 2014

(54) INPUT PARAMETER VALUE SET IDENTIFYING APPARATUS AND METHOD

(75) Inventor: Kazuhiro Matsumoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 821 days.

(21) Appl. No.: 12/915,611

(22) Filed: Oct. 29, 2010

(65) Prior Publication Data

US 2011/0106511 A1    May 5, 2011

(30) Foreign Application Priority Data

Nov. 2, 2009   (JP) ................................. 2009-252373

(51) Int. Cl.
*G06F 17/50*   (2006.01)

(52) U.S. Cl.
CPC .................................. *G06F 17/5036* (2013.01)
USPC ............................................................ 703/14

(58) Field of Classification Search
CPC .................................................. G06F 17/5018
USPC ................. 703/2, 14; 706/106, 110, 132, 136
See application file for complete search history.

(56) References Cited

U.S. PATENT DOCUMENTS

| | | | |
|---|---|---|---|
| 5,774,382 A * | 6/1998 | Tyler et al. | 703/2 |
| 7,047,505 B2 * | 5/2006 | Saxena et al. | 716/54 |
| 7,685,543 B2 | 3/2010 | Tsuji et al. | |
| 2007/0100591 A1 | 5/2007 | Harazaki | |
| 2009/0037855 A1 | 2/2009 | Tanefusa et al. | |

FOREIGN PATENT DOCUMENTS

| | | |
|---|---|---|
| JP | 2001-148333 A | 5/2001 |
| JP | 2007-080062 A | 3/2007 |
| JP | 2008-242927 A | 10/2008 |

* cited by examiner

*Primary Examiner* — Kamini S Shah
*Assistant Examiner* — Luke Osborne
(74) *Attorney, Agent, or Firm* — Fujitsu Patent Center

(57) ABSTRACT

For each input variable value set, an indicator value associated with dispersion of actually measured output variable values is calculated from data including, for each input variable value set, the actually measured output variable values. Then, a processing to cause a simulator to compute a calculated output variable value for each combination of a candidate input parameter value sets and one input variable value set, and a processing to calculate, for each candidate input parameter value set, an entire error obtained by taking into consideration, with respect to all input variable value sets, partial errors obtained respectively by evaluating, by the indicator value for a corresponding input variable value set, difference between the calculated and actually measured output variable values for the corresponding input variable value set are repeated to identify the candidate input parameter value set making the entire error minimum.

11 Claims, 33 Drawing Sheets

| GATE LENGTH | GATE WIDTH | VOLTAGE | ACTUALLY MEASURED ELECTRIC CURRENT VALUE |
|---|---|---|---|
| 10 | 20 | 30 | 40 |
| 50 | 60 | 70 | 80 |
| ... | ... | ... | ... |

| GATE LENGTH | GATE WIDTH | STANDARD DEVIATION |
|---|---|---|
| 10 | 20 | 30 |
| 40 | 50 | 60 |
| ... | ... | ... |

| INPUT PARAMETER 1 | INPUT PARAMETER 2 | ... | INPUT PARAMETER m |
|---|---|---|---|
| p11 | p12 | ... | p1m |
| p21 | p22 | | p2m |
| p31 | p32 | ... | p3m |
| ... | ... | ... | ... |

| GATE LENGTH | GATE WIDTH | VOLTAGE | INPUT PARAMETER 1 | INPUT PARAMETER 2 | ... | CALCULATED ELECTRIC CURRENT VALUE |
|---|---|---|---|---|---|---|
| 10 | 20 | 30 | p11 | p12 | ... | 40 |
| 50 | 60 | 70 | p21 | p22 | ... | 80 |
| ... | ... | ... | ... | ... | ... | ... |

FIG.15

| INPUT PARAMETER 1 | INPUT PARAMETER 2 | ... | ENTIRE ERROR |
|---|---|---|---|
| p11 | p12 | ... | te1 |
| p21 | p22 | ... | te2 |
| ... | ... | ... | ... |

| INPUT VARIABLE 1 | INPUT VARIABLE 2 | ... | ACTUAL MEASUREMENT VALUE OF OUTPUT VARIABLE |
|---|---|---|---|
| 10 | 20 | ... | 20 |
| 30 | 40 | ... | 40 |
| ... | ... | ... | ... |

| INPUT VARIAVLE 1 | INPUT VARIABLE 2 | ... | STANDARD DEVIATION OF ACTUALLY MEASURED OUTPUT VARIABLE VALUES |
|---|---|---|---|
| 10 | 20 | ... | 20 |
| 30 | 40 | ... | 40 |
| ... | ... | ... | ... |

| INPUT VARIABLE 1 | INPUT VARIABLE 2 | ... | INPUT PARAMETER 1 | INPUT PARAMETER 2 | ... | CALCULATED OUTPUT VARIABLE VALUE |
|---|---|---|---|---|---|---|
| 10 | 20 | ... | p11 | p12 | ... | 20 |
| 30 | 40 | ... | p21 | p22 | ... | 40 |
| ... | ... | ... | ... | ... | ... | ... |

FIG.29

| GATE LENGTH | GATE WIDTH | WEIGHT |
|---|---|---|
| 10 | 20 | 30 |
| 40 | 50 | 60 |
| ... | ... | ... |

INPUT PARAMETER VALUE SET IDENTIFYING APPARATUS AND METHOD

CROSS-REFERENCE TO RELATED APPLICATIONS

This application is based upon and claims the benefit of priority of the prior Japanese Patent Application No. 2009-252373, filed on Nov. 2, 2009, the entire contents of which are incorporated herein by reference.

FIELD

This technique relates to a technique for identifying input parameter values used for simulation.

BACKGROUND

Currently, design and development of circuits or the like by using the computer simulation are widely carried out. Although it is assumed that the simulator realizes actual values in the circuits or the like by the calculated output values, errors occur, actually. For example, as depicted in FIG. 1, in a graph whose horizontal axis represents an input variable value inputted to the simulator and whose vertical axis represents an output variable value from the simulator, it is assumed that a curve "a" in case where "10" is set to an input parameter, which is set separately from the input variable, and a curve "b" in case where "20" is set to the input parameter are obtained. On the other hand, when actual values for specific input variable values are plotted as diamond-shaped points, a curve represented by the diamond-shaped points is almost identical with the curve "b" in case where "20" is set to the input parameter in this example. However, when "10" is set to the input parameter, the curve "a" represented by the calculated values is far from points of the actual values. Thus, it is preferable that the errors are minimized by adjusting the input parameter values for the simulator.

More specifically, a case is considered where Simulation Program with Integrated Circuit Emphasis (SPICE) is used to carry out simulation of the electric current and voltage characteristic of transistors. In such a case, as depicted in FIG. 2, it is assumed that model parameters of the Berkeley Short-Channel IGFET Model (BSIM), which is well-known as the input parameters, are adopted as the input parameters, voltage, gate length and gate width are adopted as the input variables, and when those values are inputted to the SPICE simulator, values of the electric current, which is an output variable, are outputted.

In such a case, for certain input parameter values, a relation between values of the voltage, which is the input variable, and values of the electric current, which is the output variable, is obtained as results of the simulation, as depicted in FIG. 3. On the other hand, FIG. 4 is obtained when relations between specific voltage values and actual values of the electric current are plotted additionally to FIG. 3. Namely, errors represented by the lengths of the arrows occur.

Conventionally, by using, as an error function, $\Sigma$(calculation value−actual measurement value)$^2$*weight, the input parameter values are adjusted so as to minimize the value of this error function. Incidentally, the user adjusts the weight to carry out fitting in conformity with his or her sense. However, it is difficult to appropriately set the weight, and even when the weight is set once, the input parameter values have to be adjusted again. Furthermore, the setting of the weight depends on the user's skill, and it is difficult to indicate the objective basis.

Incidentally, some conventional techniques are known for the setting of the input parameters. For example, in a conventional technique, second-order model parameters are generated by carrying out fitting to actual operational terminal voltage condition of devices such as transistors included in the designed circuits and the circuit simulation is carried out by using the second-order model parameters. However, the weight is not considered in this conventional technique.

In addition, another technique exists as follows: Namely, a device model expression and initial values of device parameters are inputted. Then, by carrying out calculation based on the initial values of the device parameters stored in a storage device storing the inputted device model expression and the initial values of the device parameters, and desired voltage-electric current characteristic of the transistors, first to fourth voltages are calculated respectively. The first voltage is a voltage of a source region edge adjacent to a gate electrode edge of a gate electrode side surface on a polycrystalline silicon layer in the transistor, the second voltage is a voltage of the source region edge on an isolated substrate side surface on the polycrystalline silicon layer, the third voltage is a voltage of a drain region edge adjacent to the gate electrode edge on a gate electrode side surface on the polycrystalline silicon layer in the transistor, and the fourth voltage is a voltage of the drain region edge on the isolated substrate side surface on the polycrystalline silicon layer. Furthermore, by substituting these first to fourth voltages into the device model expression stored in the storage device, the drain electric current value is calculated. Then, by comparing the desired voltage-electric current characteristic stored in the storage device with the voltage-electric current characteristic based on the drain electric current obtained by the aforementioned calculation, and changing the device parameters until the difference becomes equal to or less than the allowable error, the model parameters are obtained. However, the weight is not considered in this conventional technique.

Furthermore, a technique exists that a parameter adjusting processing of a physical model including plural parameters is automatically carried out by using Genetic Algorithm. However, the weight used in the error function is not considered in the conventional technique.

Namely, the conventional techniques cannot set the input parameter values for the simulation, appropriately, and cannot evaluate the error between the calculation value by the simulation and the actual measurement value.

SUMMARY

An input parameter value set identifying method includes (A) calculating, for each of input variable value sets, which are set in advance, an indicator value associated with dispersion of actually measured output variable values from data stored in a first storage device, and storing the calculated indicator value into a second storage device, wherein the first storage device stores, for each of said input variable value sets, the actually measured output variable values; (B) repeating (1) a processing to cause a simulator for computing a calculated output variable value that is a calculated value of an output variable from a certain input parameter value set and a certain input variable value set to compute a calculated output variable value for each combination of one of candidate input parameter value sets and one of the input variable value sets, and (2) a processing to calculate, for each of said candidate input parameter value sets, (a) a first entire error that is a result obtained by taking into consideration, with respect to all of the input variable value sets, first partial errors obtained respectively by evaluating, by using the indicator value for a corresponding input variable value set, which is stored in the second storage device, a difference between the calculated output variable value and the actually measured output variable value for the corresponding input variable value set, which is stored in the first storage device, or (b) a second entire error that is a result obtained by taking into consideration, with respect to all of the input variable value sets, second partial errors, each of which is the difference, while weighting by using the indicator value for the corresponding input variable value set; (C) identifying the candidate input parameter value set making the first or second entire error minimum, and storing the identified candidate input parameter value set into an output data storage device.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 15 is a diagram depicting an example of data stored in a calculated value data storage;

FIG. 29 is a diagram depicting an example of data stored in the calculated value data storage;

DESCRIPTION OF EMBODIMENTS

Embodiment 1

Figure 1:
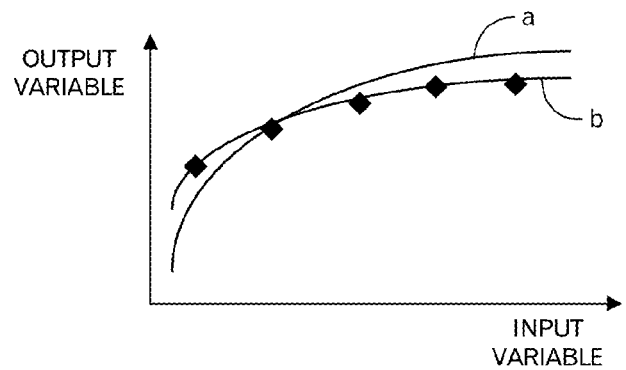
FIG. 1 is a diagram depicting a relation between an input variable and an output variable.
Figure 2:
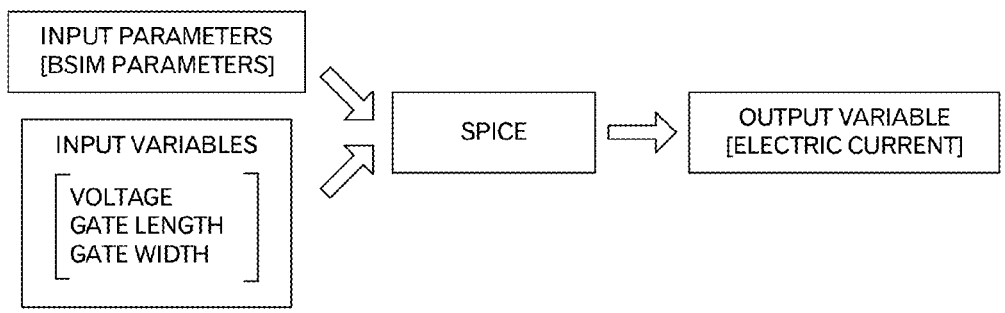
FIG. 2 is a diagram to explain an outline of a circuit simulation.
Figure 3:
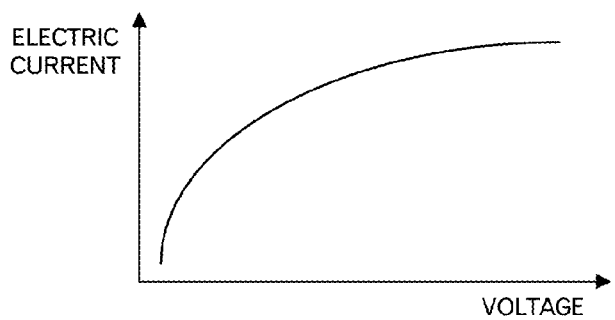
FIG. 3 is a diagram depicting a relation between the voltage and the electric current.
Figure 4:
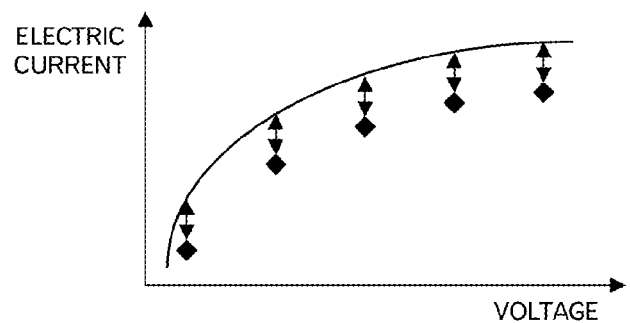
FIG. 4 is a diagram to explain an error between a calculated value and an actual measurement value.

In this embodiment, as depicted in FIG. 2, it is assumed that the simulator is the SPICE simulator, the input parameters are the BSIM parameters, the input variables are the voltage, gate length and gate width, and the output variable is the electric current.

Figure 5:
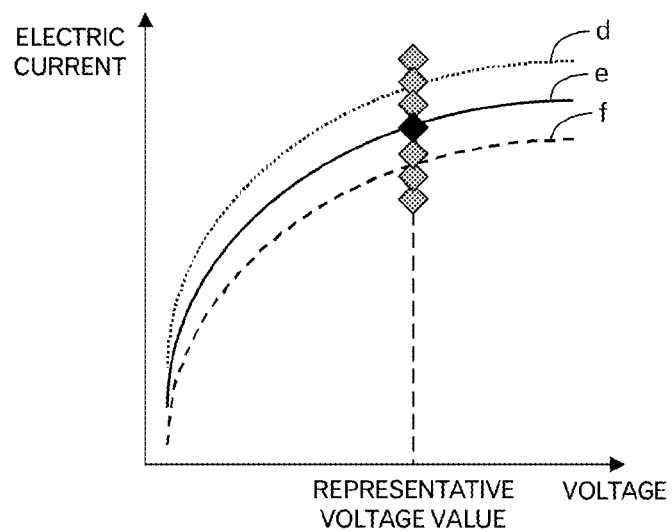
FIG. 5 is a diagram to explain measurement mode of the electric current values.

Incidentally, even in case of the transistors whose combination of the gate length and gate width is identical, the voltage-electric current characteristic varies, and furthermore, even in case of the same transistor, the measurement error occurs. Therefore, the voltage-electric current characteristic varies for each measurement. Accordingly, properly speaking, for each combination of the gate length and gate width, measurement has to be carried out for a lot of applicable transistors, a lot of times to draw the voltage-electric current curve. However, such measurement requires a lot of works and costs. Therefore, in this embodiment, as depicted in FIG. 5, the measurement of the electric current values at a representative voltage value is carried out for a lot of applicable transistors (or a lot of times for the same transistor). On the other hand, the electric current value is measured for each voltage value, while comprehensively changing the voltage values for a small number of transistors. Namely, as depicted in FIG. 5 by curves d to f, the measurement is carried out so as to draw the voltage-electric current curves. Then, the voltage-electric current curve (a solid curve e in FIG. 5) for a transistor for which the same electric current value or the electric current value close to the electric current value that is the median (a black diamond-shaped point in FIG. 5) at the representative voltage value is measured is selected and used for an evaluation target in the error function.

Figure 6:
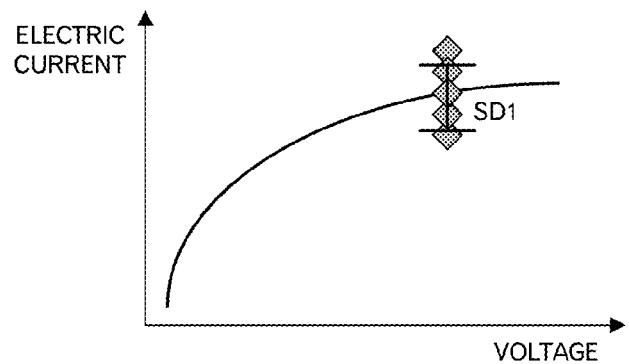
FIG. 6 is a diagram to explain the standard deviation.
Figures 7, 9, 11:
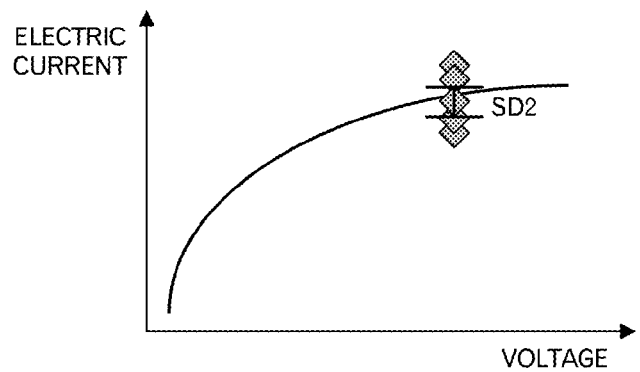
FIG. 7 is a diagram to explain the standard deviation.
FIG. 9 is a diagram depicting an example of data stored in an actual measurement value data storage.
FIG. 11 is a diagram depicting an example of data stored in a standard deviation storage.

In addition, in this embodiment, the error between the calculated electric value and actually measured electric current value is evaluated by using the standard deviation of the actually measured electric current values measured at the representative voltage value. Namely, the error is evaluated according to the dispersion degree of the actual measurement values. For example, as depicted in FIG. 6, in case where the dispersion of the actual measurement values is large and the standard deviation SD1 becomes large, there is no large problem, even if the difference between the actual measurement value and calculated value becomes large. However, as depicted in FIG. 7, in case where the dispersion of the actual measurement values is small and the standard deviation SD2 is small, there is a large problem, when the difference between the actual measurement value and the calculated value is the same value as the value in FIG. 6, because the measurement values are largely dislocated from the average value. When evaluating the error while taking into consideration such matters, it becomes possible to adjust the error, automatically, objectively and quantitatively.

Figure 8:
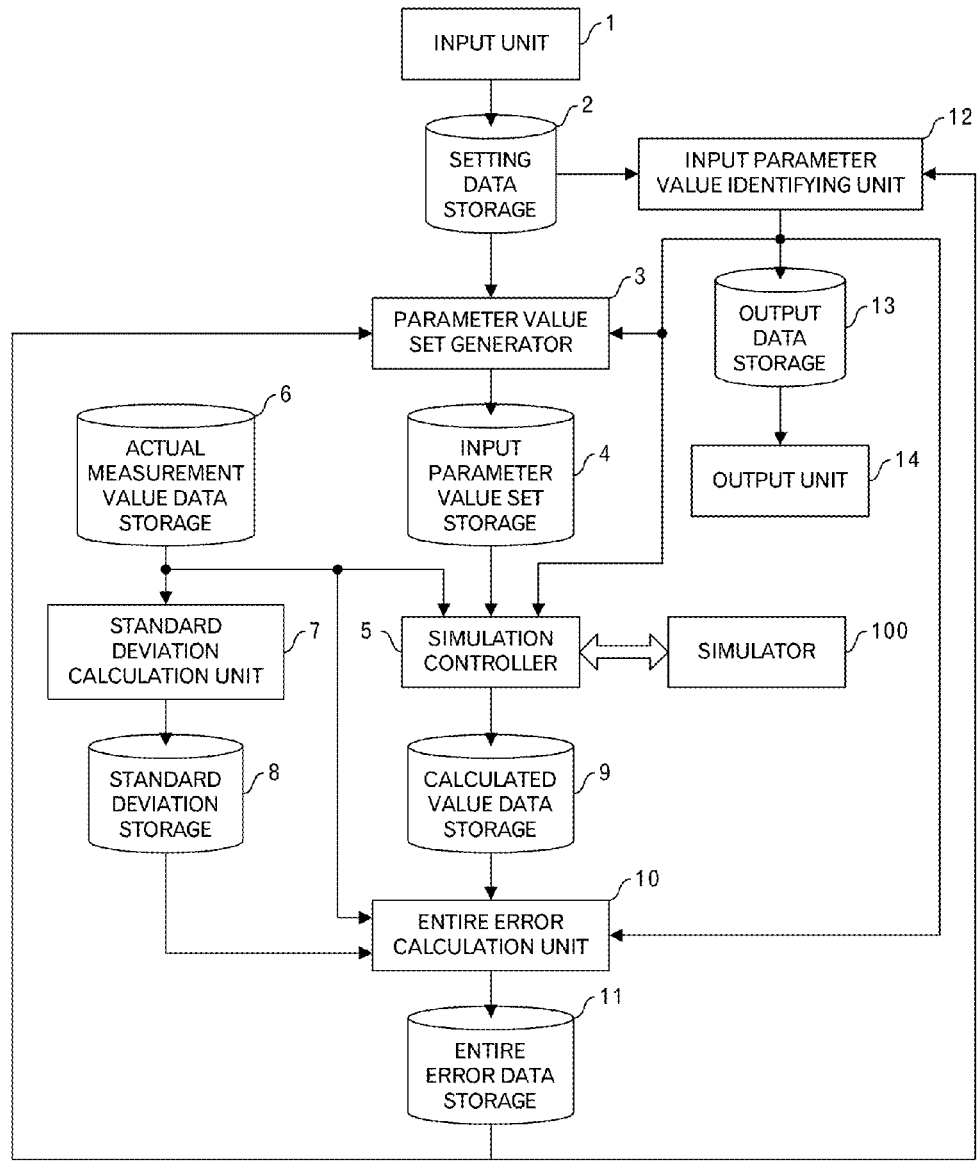
FIG. 8 is a functional block diagram of an input parameter value set identifying apparatus relating to embodiments 1 to 6.

Under such consideration, an input parameter value set identifying apparatus relating to this embodiment has a configuration as depicted in FIG. 8. Namely, the input parameter value set identifying apparatus has (A) an input unit 1 to accept inputs of setting data; (B) a setting data storage 2 storing the setting data accepted by the input unit 1; (C) a parameter value set generator 3 to carry out a processing using data stored in the setting data storage 2 and the like; (D) an input parameter value set storage 4 storing data generated by the parameter value set generator 3; (E) an actual measurement value data storage 6 storing actually measured output variable values; (F) a standard deviation calculation unit 7 to carry out a processing by using data stored in the actual measurement value data storage 6; (G) a standard deviation storage 8 storing data of the standard deviation calculated by the standard deviation calculation unit 7; (H) a simulation controller 5 to carry out a processing by using data stored in the actual measurement value data storage 6 and the input parameter value set storage 4; (I) a calculated value data storage 9 storing simulation results obtained by the simulation controller 5; (J) an entire error calculation unit 10 to carryout a processing by using data stored in the actual measurement value data storage 6, the standard deviation storage 8 and the calculated value data storage 9; (K) an entire error data storage 11 storing processing results of the entire error calculation unit 10; (L) an input parameter value identifying unit 12 to carry out a processing by using data stored in the setting data storage 2 and the entire error data storage 11; (M) an output data storage 13 storing the input parameter value set finally identified by the input parameter value identifying unit 12; and (N) an output unit 14 data stored in the output data storage 13 to an output device (e.g. printer, display apparatus or the like) or other computers.

The input parameter value identifying unit 12 controls the parameter value set generator 3, the simulation controller 5 and the entire error calculation unit 10. The simulation controller 5 causes a simulator 100 such as a circuit simulator to carry out simulation by inputting the input variable value sets and input parameter value sets, and obtains, as results of the simulation, output variable values. The parameter value set generator 3 generates the input parameter value sets used in next iteration processing, based on the value of the entire error stored in the entire error data storage 11 according to a predetermined algorithm. Incidentally, the parameter value set generator 3 also generates an initial input parameter value set. In addition, the simulation controller 5 communicates with the input parameter value identifying unit 12.

The actual measurement value data storage 6 stores data in a format as depicted in FIG. 9, for example. Namely, the actual measurement value of the electric current (hereinafter, also denoted as "actually measured electric current value") is stored for each combination of the gate length, gate width and voltage value. Incidentally, as explained by using FIG. 5, at least one actually measured electric current value is stored in association with each of the predetermined number of voltage values, for each combination of the gate length and gate width. Moreover, for each combination of the gate length and gate width, plural actually measured electric current values are stored for the representative voltage value.

Next, processing contents of the input parameter value set identifying apparatus relating to this embodiment will be explained by using FIGS. 10 to 19. First, the input unit 1 prompts the user to input the number of the initial input parameter value sets to be generated, accepts the input of the number of sets from the user, and stores the inputted data into the setting data storage 2 (step S1). In addition, the input unit 1 prompts the user to input the upper limit number of iterations in the iteration processing for optimization, which will be carried out in the following, accepts the input of the upper limit number of the iterations from the user, and stores the inputted data into the setting data storage 2 (step S3). Incidentally, the input unit 1 may prompt the user to input the actual measurement value data, accept the input of the actual measurement value data, and store the inputted data into the actual measurement value data storage 6. Moreover, the input unit 1 may obtain a file including the actual measurement value data from another computer, and store the obtained data into the actual measurement value data storage 6.

In addition, the standard deviation calculation unit 7 calculates, for each combination of the gate length and gate width, which are stored in the actual measurement value data storage 6, the standard deviation of the actually measured electric current values for the representative voltage value, which are stored in the actual measurement value data storage 6, and stores the calculated standard deviation into the standard deviation storage 8 (step S5). The standard deviation is well-known. Therefore, the further explanation is omitted. By this processing, the standard deviation storage 8 stores data in a format as depicted in FIG. 11, for example. Namely, for each combination of the gate length and gate width, the standard deviation of the electric current values is stored.

Then, the input parameter value identifying unit 12 instructs the parameter value set generator 3 to carry out a processing, and the parameter value set generator 3 carries out an initial input parameter value set determination processing according to the instruction (step S7). The initial input parameter value set determination processing will be explained by using FIG. 12.

Figures 12, 13:
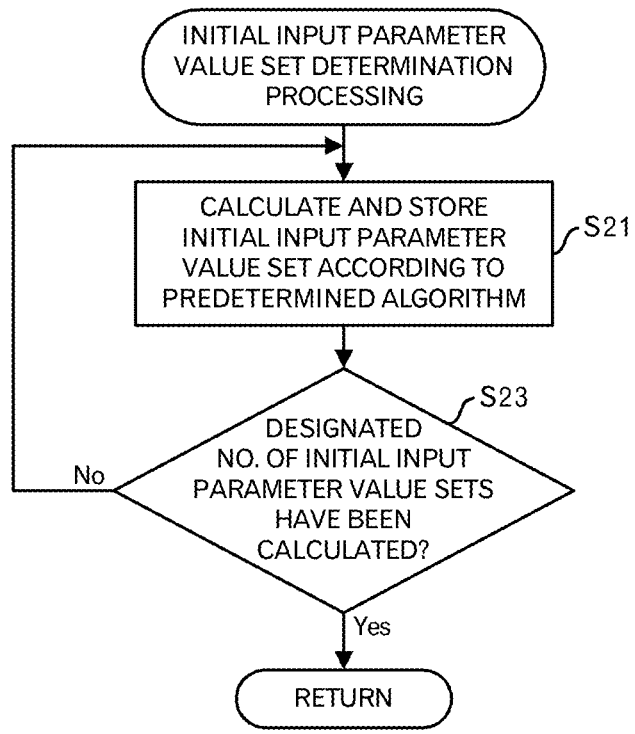
FIG. 12 is a diagram depicting a processing flow of an initial input parameter value set determination processing in the embodiment 1.
FIG. 13 is a diagram depicting an example of data stored in an input parameter value set storage.

In the processing in FIG. 12, the parameter value set generator 3 calculates an initial input parameter value set according to a predetermined algorithm, and stores the calculated data into the input parameter value set storage 4 (step S21). Because of the initial values, there is no problem even if calculation is carried out in any method. However, the initial values are calculated within value ranges of the input parameters, for each of the input parameters, according to a method such as a random sampling. The input parameter value set storage 4 stores data as depicted in FIG. 13, for example. As depicted in FIG. 13, a value is registered for each of the input parameters 1 to m. Incidentally, when the designated number of sets is M, M records are registered, finally.

Then, the parameter value set generator 3 judges whether or not the designated number of input parameter value sets have been generated (step S23). When the designated number of input parameter value sets have not been generated, the processing returns to the step S21. On the other hand, when the designated number of input parameter value sets have been generated, the processing returns to the calling source processing.

Figure 10:
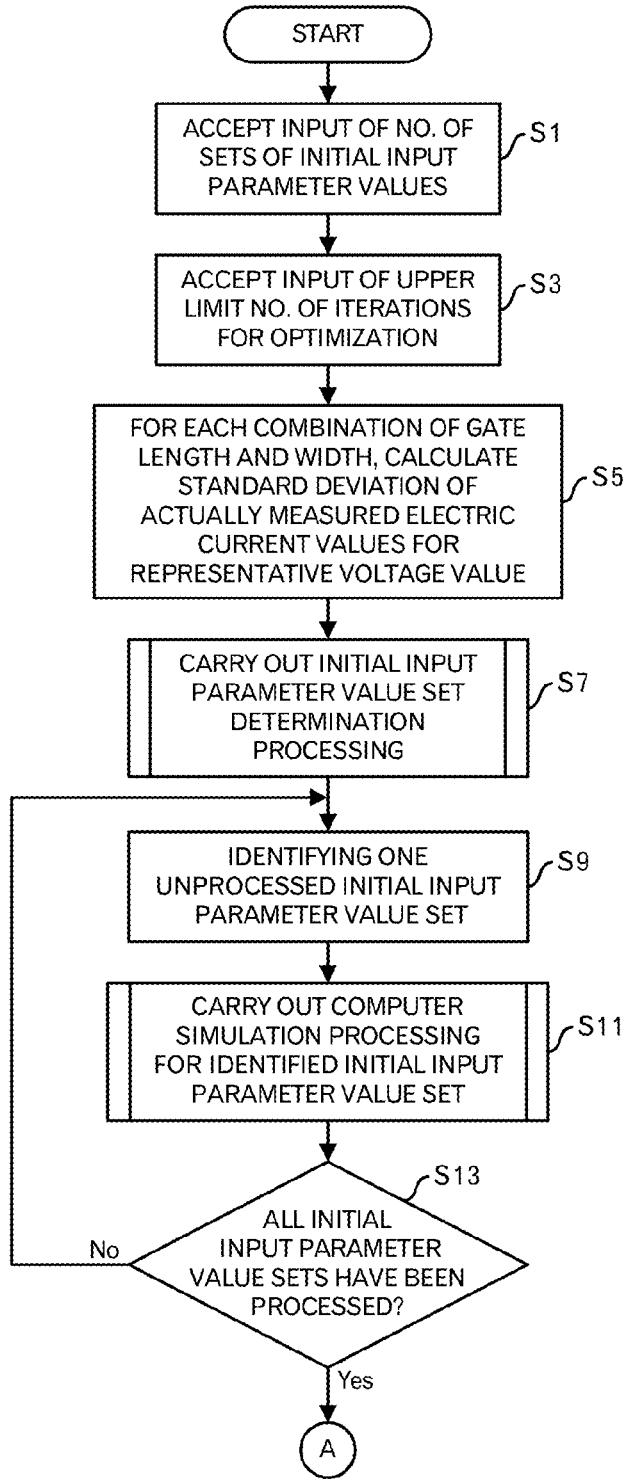
FIG. 10 is a diagram depicting a main processing flow for embodiment 1.

Returning to the explanation of the processing in FIG. 10, the input parameter value identifying unit 12 instructs the simulation controller 5 to carry out a processing, and the simulation controller 5 identifies one unprocessed set of the initial input parameter value sets stored in the input parameter value set storage 4 according to the instruction (step S9). Then, the simulation controller 5 and the like carry out a computer simulation processing for the identified initial input parameter value set (step S11). The computer simulation processing for the identified initial input parameter value set will be explained by using FIGS. 14 and 15.

Figure 14:
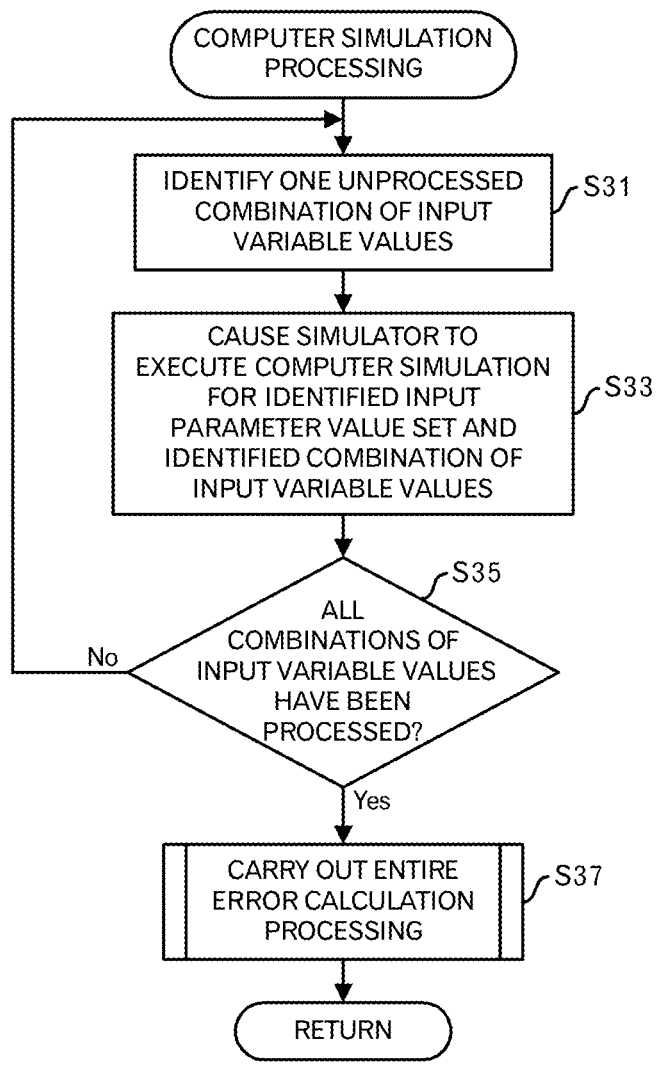
FIG. 14 is a diagram depicting a processing flow of a computer simulation processing in the embodiment 1.

In the processing of FIG. 14, the simulation controller 5 identifies one unprocessed combination of the input variable values (here, gate length, gate width and voltage value) in the actual measurement value data storage 6 (step S31). Then, the simulation controller 5 causes the simulator 100 to carry out the computer simulation for the input parameter value set identified at the upper-level processing of this processing and the combination of the input variable values, which was identified at the step S31, obtains the calculated electric current value that is an output variable value from the simulator 100, and stores the obtained data into the calculated value data storage 9 (step S33). The computer simulation is the same as the conventional one. Therefore, further explanation is omitted. The calculated value data storage 9 stores data as depicted in FIG. 15, for example. In an example of FIG. 15, the calculated electric current value is registered in association with the combination of the input variable values including the gate length, gate width and voltage value and the values of the input parameters 1 to m.

Then, the simulation controller 5 judges whether or not all combinations of the input variable values stored in the actual measurement value data storage 6 have been processed (step S35). When there is an unprocessed combination, the processing returns to the step S31. On the other hand, when all combinations of the input variable values have been processed, the simulation controller 5 notifies, for example, the input parameter value identifying unit 12 of processing completion, and after that, the input parameter value identifying unit 12 instructs the entire error calculation unit 10 to carry out the processing. Then, the entire error calculation unit 10 carries out an entire error calculation processing (step S37). This entire error calculation processing will be explained by using FIGS. 16 to 17B. Incidentally, when the entire error calculation processing is completed, the processing returns to the calling source processing.

Figure 16:
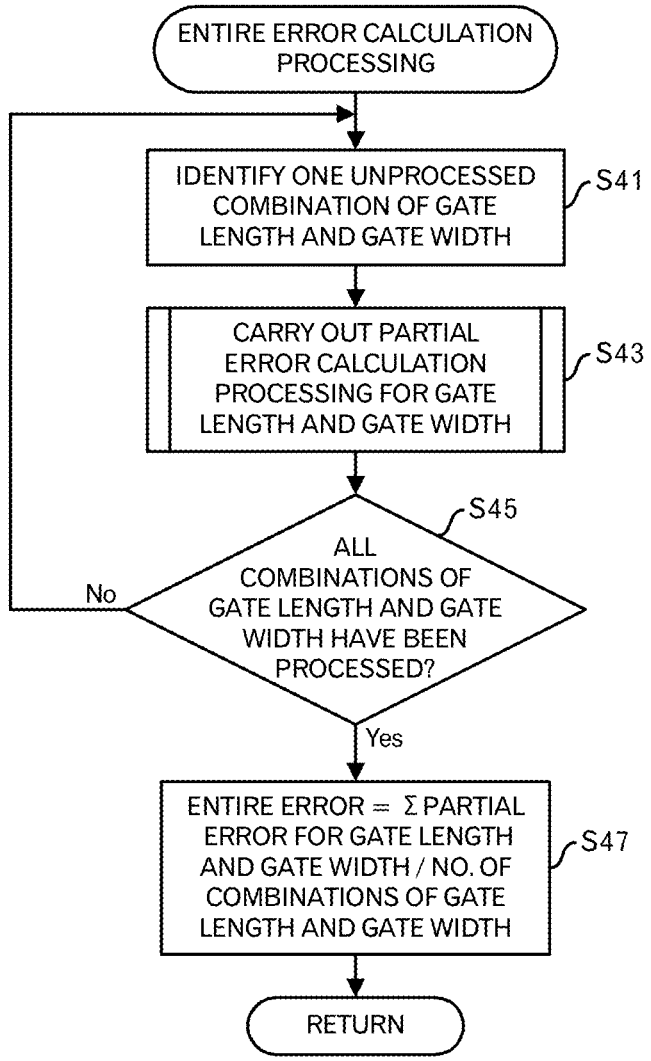
FIG. 16 is a diagram depicting a processing flow of an entire error calculation processing in the embodiment 1.

In the processing of FIG. 16, the entire error calculation unit 10 identifies one unprocessed combination of the gate length and gate width in the calculated value data storage 9 (step S41). Then, the entire error calculation unit 10 carries out a partial error calculation processing for the gate length and gate width (step S43). The partial error calculation processing relating to this embodiment will be explained by using FIGS. 17A and 17B.

Figures 17A, 17B:
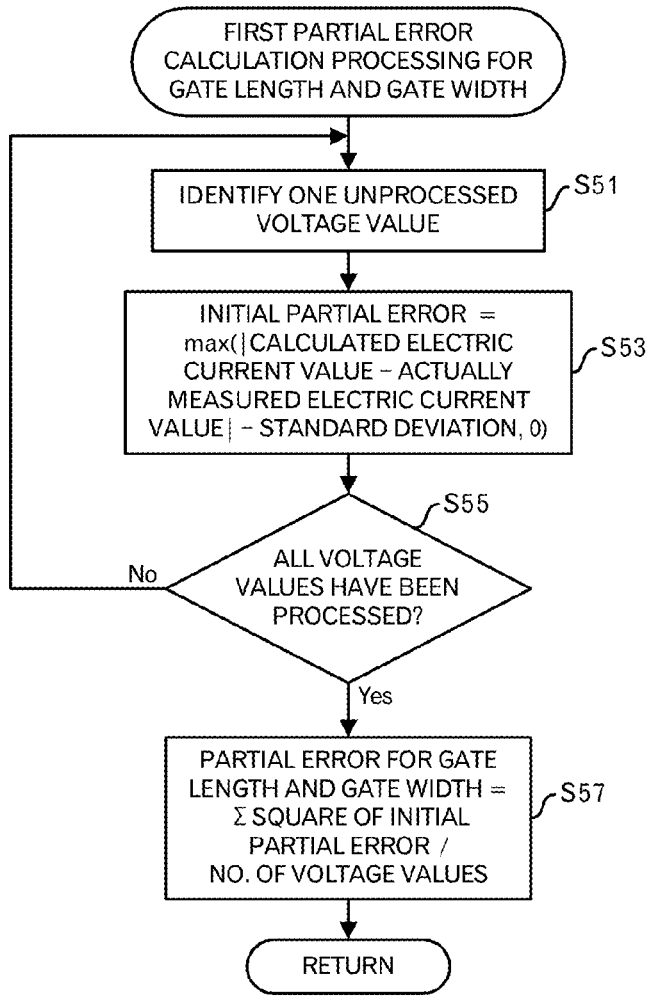
FIG. 17A is a diagram depicting a processing flow of a partial error calculation processing for a gate length and a gate width in the embodiment 1.
FIG. 17B is a diagram depicting an example of data stored in an entire error data storage.

In FIG. 17A, the entire error calculation unit 10 identifies one unprocessed voltage value in the calculated value data storage 9 (step S51). Then, the entire error calculation unit 10 calculates an initial partial error by max({|calculated electric current value−actually measured electric current value|−standard deviation}, 0), and stores the partial error into a storage device such as a main memory (step S53). The standard deviation in the expression is the standard deviation for the identified combination of the gate length and gate width and is read out from the standard deviation storage 8. By {|calculated electric current value−actually measured electric current value|−standard deviation}, it is judged whether or not a difference greater than the standard deviation exists between the calculated electric current value and the actually measured electric current value. When the difference greater than the standard deviation exists between the calculated electric current value and the actually measured electric current value, a value of {|calculated electric current value−actually measured electric current value|−standard deviation} is positive. Therefore, the value of max({|calculated electric current value−actually measured electric current value|−standard deviation}, 0) is the same positive value as {|calculated electric current value−actually measured electric current value|−standard deviation}. On the other hand, when no difference greater than the standard deviation exists between the calculated electric current value and the actually measured electric current value, the final value becomes "0". Therefore, when only difference less than the standard deviation exists between the calculated electric current value and the actually measured electric current value, the partial error to be ignored is calculated. Thus, an error is evaluated based on the standard deviation calculated according to the dispersion of the actual measurement values.

Then, the entire error calculation unit 10 judges whether or not all of the voltage values in the calculated value data storage 9 have been processed (step S55). When there is an unprocessed voltage value, the processing returns to the step S51.

On the other hand, when all of the voltage values have been processed, the entire error calculation unit 10 calculates a partial error for the identified gate length and gate width by Σ(square of initial partial error/the number of voltage values), and stores the partial error into the storage device such as the main memory (step S57). "Σ" means a sum for all voltage values. When such a processing is carried out, the processing returns to the calling source processing.

Returning to the explanation of the processing in FIG. 16, the entire error calculation unit 10 judges whether or not all combinations of the gate length and gate width have been processed in the calculation value data storage 9 (step S45).

When there is an unprocessed combination, the processing returns to the step S41. On the other hand, when all of the combinations have been processed, the entire error calculation unit 10 calculates an entire error by Σ(partial error for gate length and gate width/the number of combinations of gate length and gate width), and stores the calculated value of the entire error into the entire error data storage 11 in association with the input parameter value set (step S47). "Σ" represents a sum for all combinations of the gate length and gate width. Substantially, the root mean square of the partial errors for the gate length and gate width is calculated. After carrying out such a processing, the processing returns to the calling source processing.

The entire error data storage 11 stores data as depicted in FIG. 17B, for example. In an example of FIG. 17B, the calculated value of the entire error is registered in association with the adopted input parameter value set (parameter values of the input parameters 1 to m).

When such a processing is carried out, the processing returns to the processing of FIG. 10. Then, the simulation controller 5 judges whether or not all sets of the initial input parameter values have been processed (step S13). When there is an unprocessed set, the processing returns to the step S9. On the other hand, when all sets have been processed, the processing shifts to a processing of FIG. 18 through a terminal A.

Figure 18:
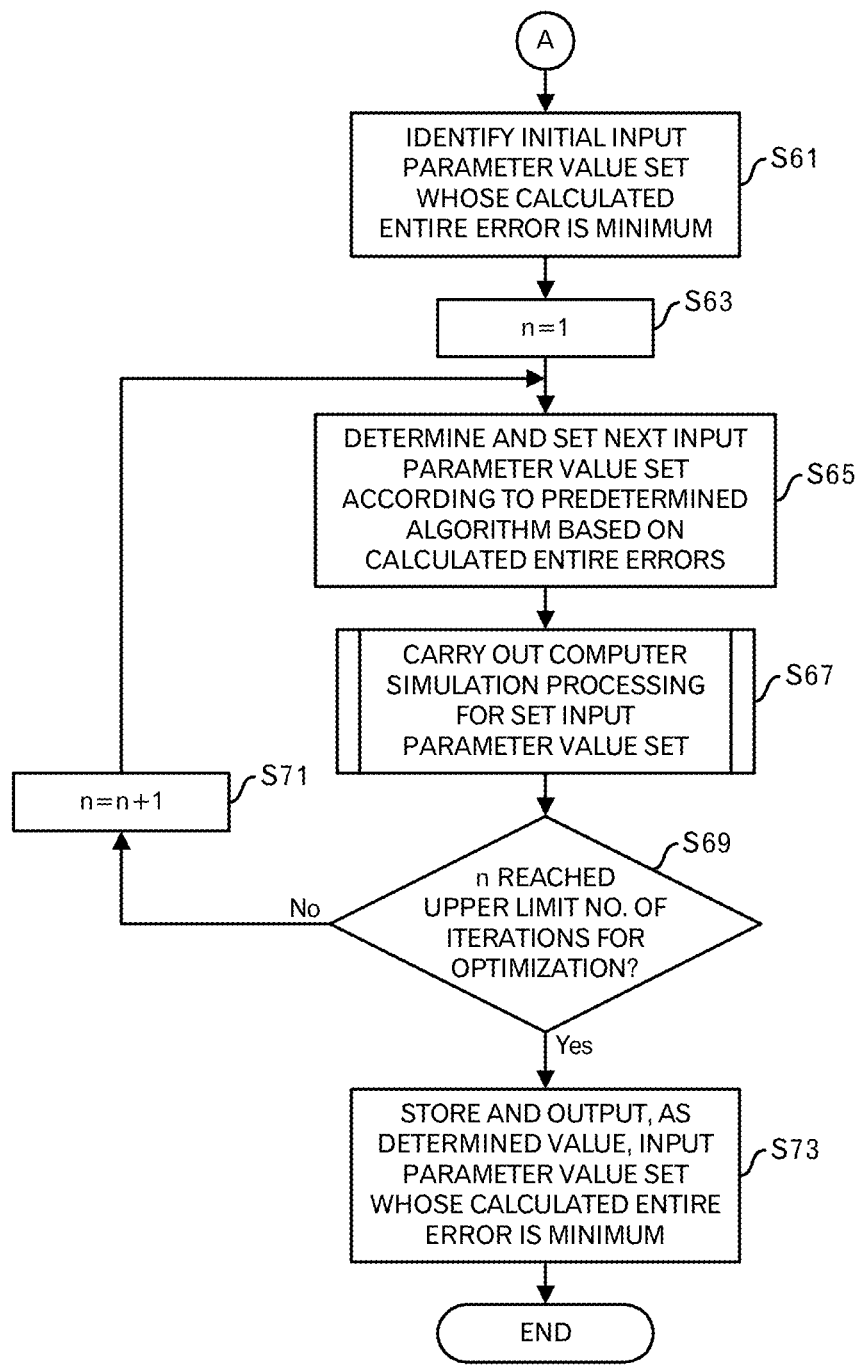
FIG. 18 is a diagram depicting a main processing flow in the embodiment 1.

Shifting to explanation of the processing of FIG. 18, the input parameter value identifying unit 12 identifies an initial input parameter value set whose entire error is minimum and which is stored in the entire error data storage 11 (step S61). Incidentally, not only the initial input parameter value set whose entire error is minimum but also the initial input parameter value sets whose entire error is a second value or third value in an ascending order of the entire errors may be identified. Thus, the initial value is identified on the optimization of the input parameter value set.

Figure 19:
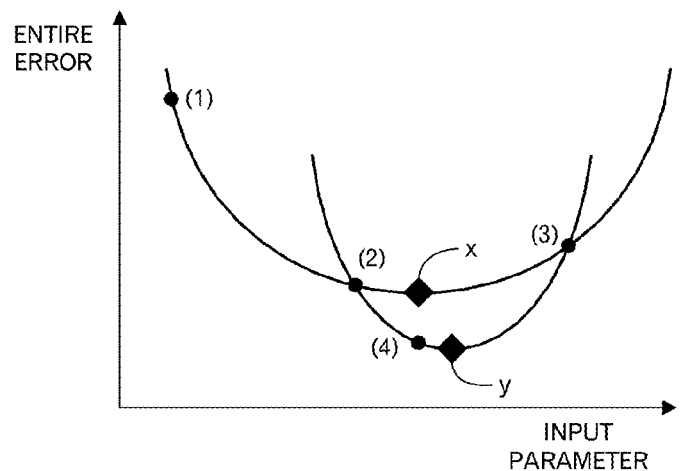
FIG. 19 is a diagram to explain optimization of the input parameter values.

For example, as depicted in FIG. 19, when the relation between the input parameter and the entire error is represented simply, points (1) to (3) are obtained at the step S61. Then, when a second-order curve is assumed from these points, it can be predicted that a point "x" whose entire error is a local minimum exists. Therefore, the input parameter value set for the point "x" is generated. It is assumed that, when the entire error is actually calculated, the much smaller value of the entire error is calculated to obtain a point (4). Then, when a second-order curve is assumed from the points (2) to (4), it can be predicted that a point "y" whose entire error is a local minimum exists. Then, the input parameter values for the point "y" are generated. Thus, a processing to generate a next input parameter value set by using the already calculated entire errors is carried out.

Incidentally, such a processing to generate the next input parameter value set is carried out by using a Brent method that is known as an optimization algorithm. This embodiment can adopt not only the Brent method, but also Nelder-Mead method, Powell method, steepest descent method, conjugate gradient method, genetic algorithm, simulated annealing method, evolutionary algorithm, particle swarm optimization method or the like. These methods are well-known. Therefore, further explanation is omitted.

Returning to the explanation of the processing of FIG. 18, the input parameter value identifying unit 12 sets "1" to a counter n (step S63), determines the next input parameter value set according to the aforementioned predetermined algorithm, and sets the determined next input parameter value set into the simulation controller 5 (step S65). Then, the simulation controller 5 and the like carry out the computer simulation processing for the input parameter value set being set (step S67). This processing is the same as the processing at the step S11, although the input parameter value set is different. Therefore, the detailed explanation of the processing is omitted.

The simulation controller 5 notifies the input parameter value identifying unit 12 of the processing completion, and the input parameter value identifying unit 12 judges whether or not "n" reaches the upper limit number of iterations for the optimization, which is stored in the setting data storage 2 (step S69). When "n" does not reach the upper limit number of iterations for optimization, the simulation controller 5 increments "n" by "1" (step S71), and the processing returns to the step S65. On the hand, when "n" reaches the upper limit number of iterations for optimization, the input parameter value identifying unit 12 identifies an input parameter value set whose entire error is minimum and which is stored in the entire error data storage 11, and stores the identified input parameter value set, as the determined value, into the output data storage 13. The output unit 14 outputs the input parameter value set stored in the output data storage 13 to the output apparatus (e.g. printer, display apparatus or other computers connected to the network) (step S73).

By carrying out such a processing, in the embodiment, after the error is evaluated according to the dispersion of the actual measurement values, the input parameter value set whose entire error obtained from the error is minimum can be identified. Namely, when carrying out the following computer simulation by using such an input parameter value set, it becomes possible to execute the simulation in which the entire error is small.

By adopting the standard deviation, there is no vague point that how to determine the weight value depends on the engineer's skill like the conventional art. Therefore, the input parameter value set can be determined automatically and objectively. In addition, because the standard deviation can be calculated before the optimization of the input parameter value set, there is no need to repeatedly carry out an optimization processing to fix the weight. Such effects are common to the embodiments.

Incidentally, in the first embodiment, the error function can be represented as follows:

Entire error=$\Sigma_1 \Sigma_2$\{max(\{|calculated electric current value−actually measured electric current value|−standard deviation\},0)\}$^2$/\{(the number of voltage values)*(the number of combinations of gate length and gate width)\}

Incidentally, "$\Sigma_2$" represents a sum for all voltage values in a specific combination of the gate length and gate width, and "$\Sigma_1$" represents a sum for all combinations of the gate length and gate width.

Embodiment 2

The error function is not limited to that of the first embodiment, and it is possible to adopt the following error function.

Entire error=$\Sigma_1 \Sigma_2$\{|calculated electric current value−actually measured electric current value|/standard deviation\}$^2$/\{(the number of voltage values)*(the number of combinations of gate length and gate width)\}

Incidentally, "$\Sigma_2$" represents a sum for all voltage values in a specific combination of the gate length and gate width, and "$\Sigma_1$" represents a sum for all combinations of the gate length and gate width.

Thus, the error is evaluated based on what times the standard deviation representing the dispersion of the actual measurement values is the error.

In the following, only portions different from the first embodiment will be explained. Specifically, the partial error calculation processing (FIG. 17A) for the gate length and gate width will be replaced with a processing depicted in FIG. 20. Incidentally, the functions of the input parameter value set identifying apparatus are the same as those of the first embodiment except the portions depicted in FIG. 20. Therefore, the same reference numbers depicted in FIG. 8 are used.

Figure 20:
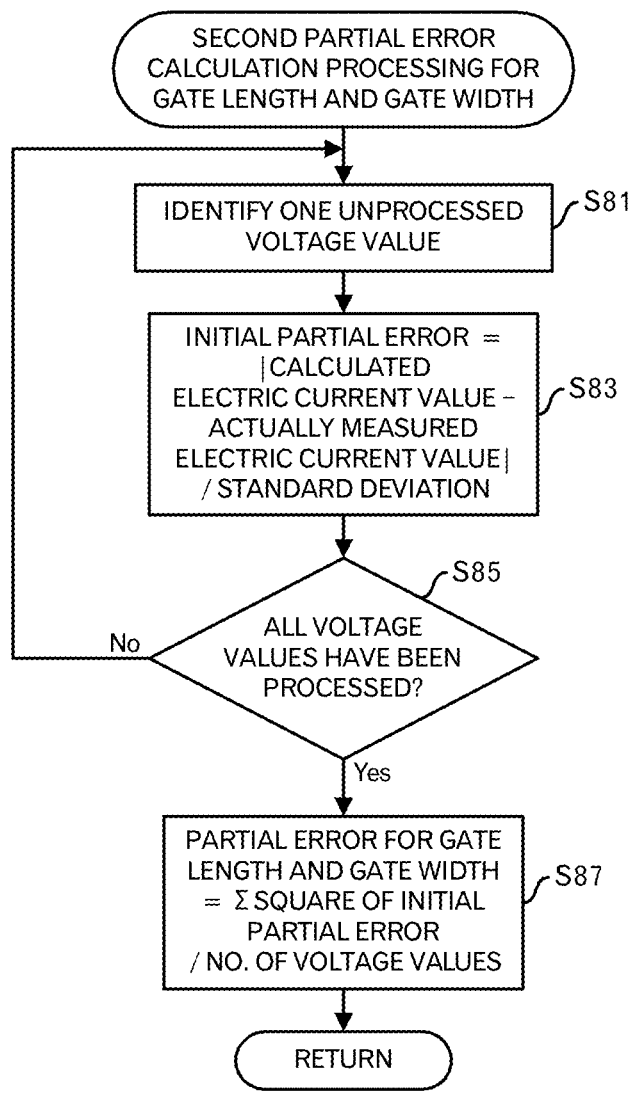
FIG. 20 is a diagram depicting a processing flow of the partial error calculation processing for the gate length and gate width in embodiment 2.

In FIG. 20, the entire error calculation unit 10 identifies one unprocessed voltage value in the calculation value data storage 9 (step S81). Then, the entire error calculation unit 10 calculates an initial partial error by {|calculated electric current value−actually measured electric current value|/standard deviation}, and stores the partial error into the storage device such as the main memory (step S83). The standard deviation in the expression is the standard deviation for the combination of the identified gate length and gate width, and is read out from the standard deviation storage 8. By {|calculated electric current value−actually measured electric current value|/standard deviation}, it is judged whether or not the difference greater than the standard deviation exists between the calculated electric current value and the actual electric current value. When the difference greater than the standard deviation exists between the calculated electric current value and the actual electric current value, the partial error is greater than "1". On the other hand, when the difference greater than the standard deviation does not exist between the calculated electric current value and the actual electric current value, the partial error is less than "1". Thus, the error is evaluated based on the standard deviation calculated according to the dispersion of the actual measurement value.

Then, the entire error calculation unit 10 judges whether or not the all voltage values stored in the calculated value data storage 9 have been processed (step S85). When there is an unprocessed voltage value, the processing returns to the step S81.

On the other hand, when all voltage values stored in the calculated value data storage 9 have been processed, the entire error calculation unit 10 calculates the partial error for the gate length and gate width by {Σ(square of initial partial error/the number of voltage values)}, and stores the partial error into the storage device such as the main memory (step S87). "Σ" represents a sum for all voltage values. When such a processing is carried out, the processing returns to the calling source processing.

As described above, the error function may be changed.

Embodiment 3

The error function is not limited to the error functions in the first and second embodiments, and a following error function may be adopted.

Entire error=$\Sigma_1\{1-\exp\{-\Sigma_2\{$|calculated electric current value−actually measured electric current value|/standard deviation$\}^2$/(the number of voltage values)$\}$/(the number of combinations of gate length and gate width)$\}$ Incidentally, "$\Sigma_2$" represents a sum for all voltage values in a specific combination of the gate length and gate width, and "$\Sigma_1$" represents a sum for all combinations of the gate length and gate width. The partial error is the same as that in the second embodiment. However, the expression format of the entire error is different. In case of the first embodiment or second embodiment, when the value of |calculated electric current value−actually measured electric current value| is greater than the standard deviation, it becomes difficult to appropriately judge how different they are in the comparison with the entire errors. On the other hand, it becomes possible to appropriately compare the entire errors by introducing this format.

In the following, only portions different from the first embodiment will be explained. Specifically, the partial error calculation processing (FIG. 17A) for the gate length and gate width is replaced with a processing depicted in FIG. 21. Incidentally, the functions of the input parameter value set identifying apparatus are the same as functions in the first embodiment except the portions depicted in FIG. 21. Therefore, the same reference numbers depicted in FIG. 8 are used.

Figures 21, 24:
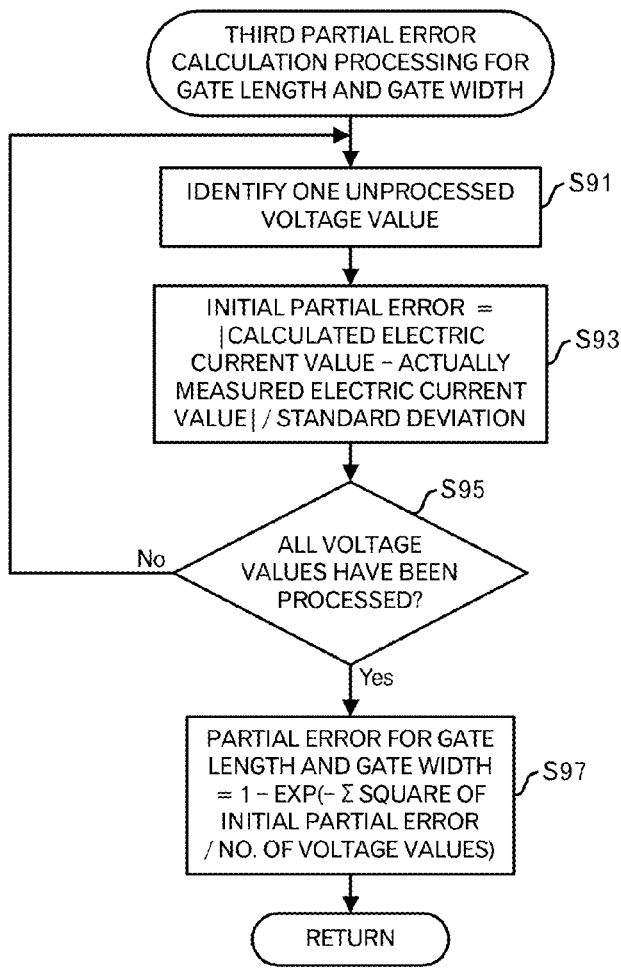
FIG. 21 is a diagram depicting a processing flow of the partial error calculation processing for the gate length and gate width in embodiment 3.
FIG. 24 is a diagram depicting an example of data stored in the measurement value data storage.

In FIG. 21, the entire error calculation unit 10 identifies one unprocessed voltage value in the calculated value data storage 9 (step S91). Then, the entire error calculation unit 10 calculates an initial partial error by {|calculated electric current value−actually measured electric current value|/standard deviation}, and stores the partial error into the storage device such as the main memory (step S93). The standard deviation in the expression is the standard deviation for the combination of the identified gate length and gate width, and is read out from the standard deviation storage 8. By {|calculated electric current value−actually measured electric current value|/standard deviation}, it is judged whether or not the difference greater than the standard deviation exists between the calculated electric current value and the actually measured electric current value. When the difference greater than the standard deviation exists between the calculated electric current value and the actually measured electric current value, the partial error becomes greater than "1". On the other hand, when the difference greater than the standard deviation does not exist between the calculated electric current value and the actually measured electric current value, the partial error becomes less than "1". Thus, the error is evaluated based on the standard deviation calculated according to the dispersion of the actual measurement value.

Then, the entire error calculation unit 10 judges whether or not all of the voltage values in the calculated value data storage 9 have been processed (step S95). When there is an unprocessed voltage, the processing returns to the step S91.

On the other hand, when all voltage values have been processed, the entire error calculation unit 10 calculates the partial error for the gate length and gate width by {1−exp{−(Σ(square of initial partial error/the number of voltage values))}}, and stores the partial error into the storage device such as the main memory (step S97). "Σ" represents a sum for all voltage values. When such a processing is carried out, the processing returns to the calling source processing.

As described above, the format of the error function can be changed.

Embodiment 4

Figure 22:
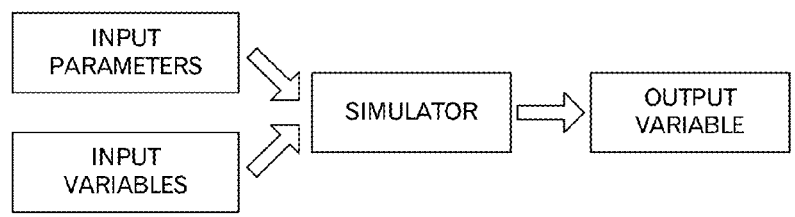
FIG. 22 is a diagram to explain an outline of the simulation.
Figure 23:
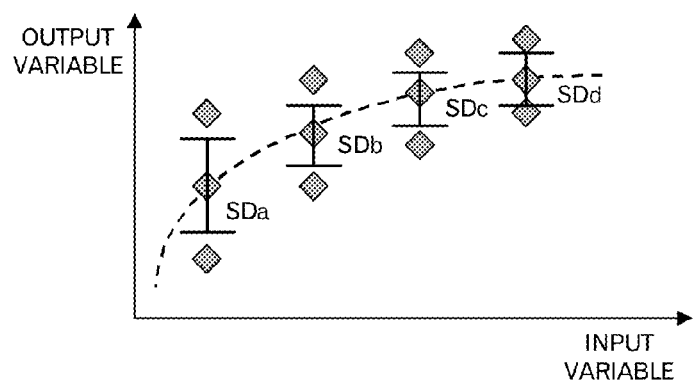
FIG. 23 is a diagram depicting measurement mode of the output variable in embodiment 4.

In the first to third embodiments, the input variables are limited to the gate length, gate width and voltage, and the output variable is limited to the electric current, and the simulation is limited to the circuit simulation. However, the consideration described in the first to third embodiments is not limited to the circuit simulation. Generally, as depicted in FIG. 22, the consideration can be applied to a case where the input parameters and the input variables are defined and the value of the output variable is obtained as a result of the calculation by a predetermined simulator by inputting those values. Incidentally, in the following, as depicted in FIG. 23, for each of plural combinations (4 in FIG. 23) of the input variable values, the measurement is carried out for the different target objects once or plural times to obtain the actual measurement values (diamond-shaped points) of the output variable or the measurement is carried out for the same target object plural times to obtain the actual measurement values (diamond-shaped points) of the output variable. Then, for each combination of the input variable values, the standard deviations SDa to SDd are calculated.

The configuration of the input parameter value set identifying apparatus is the same as that in the first embodiment except the portions described below. Therefore, the drawing is omitted.

Next, processing contents in the fourth embodiment will be explained by using FIGS. 24 to 31. This embodiment adopts the error function almost in the same format as that in the first embodiment.

Namely, in the fourth embodiment, the error function is represented as follows:

Entire error=Σ{max(|calculated output variable value−actual measurement output variable value|−standard deviation,0)}$^2$/(the number of combinations of the input variable values)

Incidentally, "Σ" represents a sum for all combinations of the input variable values.

In addition, the actual measurement value data storage 6 in this embodiment stores data in a format as depicted in FIG. 24, for example. Namely, for each combination of the values of the input variables 1 to r, the actual measurement value of the output variable (hereinafter, also referred to actually measured output variable value) is stored. Although it was also explained above, for each of the combinations of the input variable values, plural actually measured output variable values are stored.

Next, specific processing contents will be explained by using FIGS. 25 to 31. First, the input unit 1 prompts the user to input the number of initial input parameter value sets to be generated, accepts the input of the number of sets from the user, and stores the inputted data into the setting data storage 2 (step S101). In addition, the input unit 1 prompts the user to input the upper limit number of iterations in the iteration processing for optimization, which will be carried out later, accepts the upper limit number of iterations from the user, and stores the inputted data into the setting data storage 2 (step S103). Incidentally, the input unit 1 may prompt the user to input the actual measurement value data, accept the input of the actual measurement value data, and store the inputted data into the actual measurement value data storage 6. Moreover, a file including the actual measurement value data may be obtained from other computers, and be stored into the actual measurement value data storage 6.

Figures 26, 27:
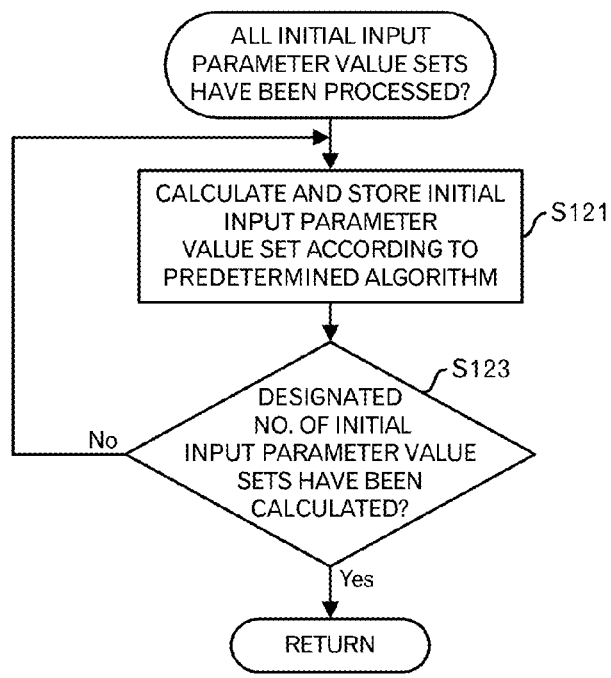
FIG. 26 is a diagram depicting an example of data stored in the standard deviation storage.
FIG. 27 is a diagram depicting a processing flow of the initial input parameter value set determination processing in the embodiment 4.

In addition, the standard deviation calculation unit 6 calculates, for each combination of the input variable values stored in the actual measurement value data storage 6, the standard deviation of the actual output variable values stored in the actual measurement value data storage 6, and stores the calculated data into the standard deviation storage 8 (step S105). The standard deviation is well-known, and the further explanation is omitted. By this processing, the standard deviation storage 8 stores data in a format as depicted in FIG. 26. Namely, for each combination of the input variables 1 to r, the standard deviation of the output variable values is stored.

Then, the input parameter value identifying unit 12 instructs the parameter value set generator 3 to carryout a processing, and the input parameter value set generator 3 carries out an initial input parameter value set determination processing according to the instruction (step S107). The initial input parameter value set determination processing will be explained by using FIG. 27.

In the processing of FIG. 27, the parameter value set generator 3 calculates the initial input parameter value sets according to a predetermined algorithm, and stores the calculated data into the input parameter value set storage 4 (step S121). Any method can be adopted, because of the initial values. For example, by using the random sampling or the like, an initial value is calculated within a value range of the input parameter for each input parameter. For example, the input parameter value set storage 4 stores data as depicted in FIG. 13, which was described in the first embodiment.

Then, parameter value set generator 3 judges whether or not the designated number of input parameter value sets have been calculated (step S123). When the designated number of input parameter value sets have not been calculated, the processing returns to the step S121. On the other hand, when the designated number of input parameter value sets have been calculated, the processing returns to the calling source processing.

Figure 25:
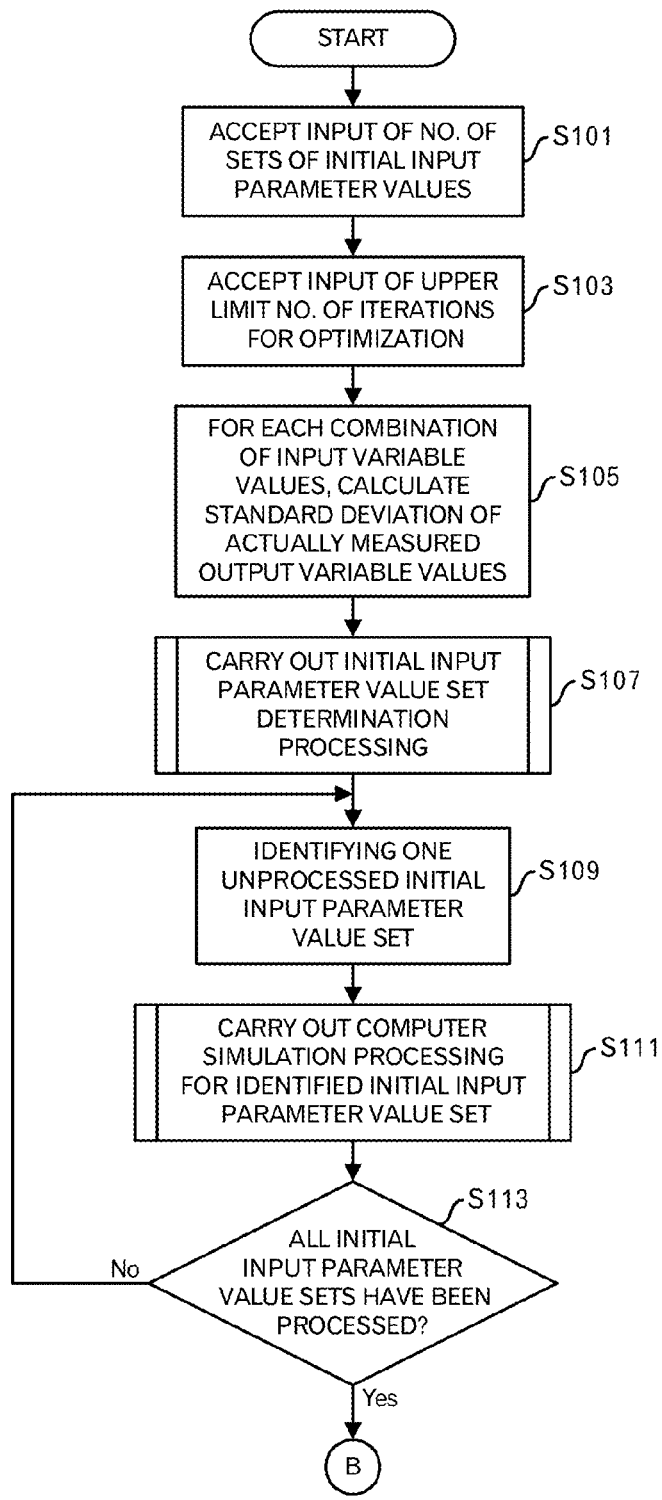
FIG. 25 is a diagram depicting a main processing flow in the embodiment 4.

Returning to the explanation of FIG. 25, the input parameter value identifying unit 12 instructs the simulation controller 5 to carryout a processing, and the simulation controller 5 identifies one unprocessed set among the initial input parameter value sets stored in the input parameter value set storage 4 according to the instruction (step S109). Then, the simulation controller 5 and the like carry out a computer simulation processing for the identified initial input parameter value set (step S111). The computer simulation processing for the identified initial input parameter value set will be explained by using FIGS. 28 to 31.

Figure 28:
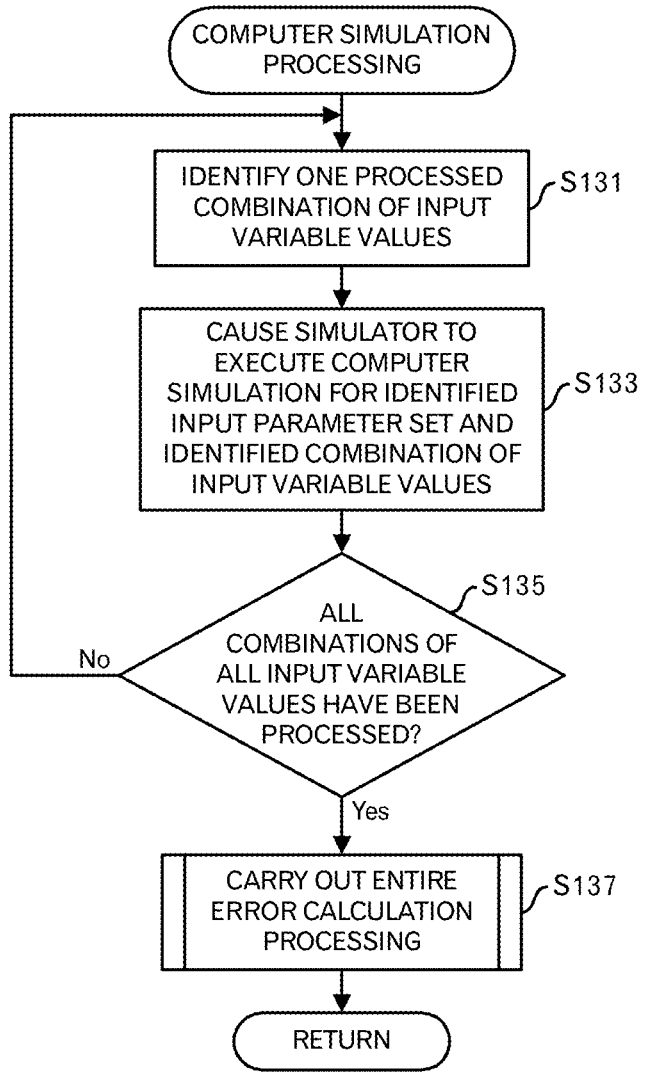
FIG. 28 is a diagram depicting a processing flow of the computer simulation processing in the embodiment 4.

In the processing of FIG. 28, the simulation controller 5 identifies one unprocessed combination of the input variable values in the actual measurement value data storage 6 (step S131). Then, the simulation controller 5 causes the simulator 100 to carry out the computer simulation for the input parameter value set identified at the upper-level processing of this processing and the combination of the input variable values, which was identified at the step S131, obtains the calculated output variable value from the simulator 100, and stores the obtained data into the calculated value data storage 9 (step S133). The computer simulation is the same as the conventional one. Therefore, the further explanation is omitted. The calculated value data storage 9 stores data as depicted in FIG. 29, for example. In an example of FIG. 29, the calculated output variable value is registered in association with the combination of the values of the input variables 1 to r and the values of the input parameters 1 to m.

Then, the simulation controller judges whether or not all combinations of the input variable values stored in the actual measurement value data storage 6 have been processed (step S135). When there is an unprocessed combination, the processing returns to the step S131. On the other hand, when all combinations of the input variable values have been processed, the simulation controller 5 notifies the input parameter value identifying unit 12 of the processing completion, and after that, the input parameter value identifying unit 12 instructs the entire error calculation unit 10 to carry out a processing. Then, the entire error calculation unit 10 carries out an entire error calculation processing (step S137). This entire error calculation processing will be explained by using FIG. 30. Incidentally, when the entire error calculation processing is completed, the processing returns to the calling source processing.

Figure 30:
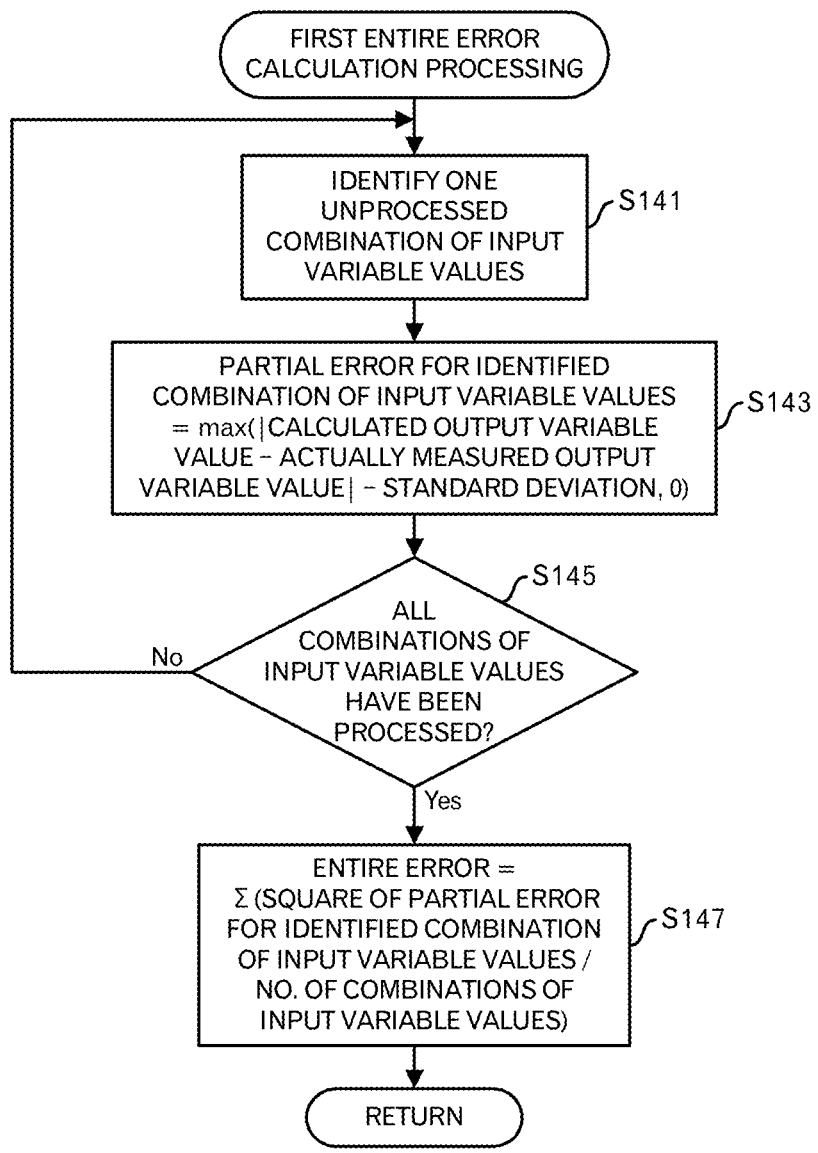
FIG. 30 is a diagram depicting a processing flow of the entire error calculation processing in the embodiment 4.

In a processing of FIG. 30, the entire error calculation unit 10 identifies one unprocessed combination of the input variable values in the calculated value data storage 9 (step S141). Then, the entire error calculation unit 10 calculates a partial error for the identified combination of the input variable values by max(|calculated output variable value−actually measured output variable value|−standard deviation, 0), and stores the partial error into the storage device such as the main memory (step S143). The standard deviation in the expression is the standard deviation for the identified combination of the input variable values, and is read out from the standard deviation storage 8. The consideration of this expression is the same as that in the first embodiment.

Then, the entire error calculation unit 10 judges whether or not all combinations of the input variable values in the calculated value data storage 9 (step S145). When there is an unprocessed combination, the processing returns to the step S141.

On the other hand, when all combinations of the input variable values have been processed, the entire error calculation unit 10 calculates an entire error by Σ(square of partial error for identified combination of input variable values/the number of combinations of input variable values), and stores the value of the entire error into the entire error data storage 11 in association with the input parameter value sets (step S147). "Σ" represents a sum for all combinations of the input variable values. When such a processing is carried out, the processing returns to the calling source processing.

The entire error data storage 11 stores data as depicted in FIG. 17B, which was explained in the first embodiment, for example.

When such a processing is carried out, the processing returns to the processing of FIG. 25. Then, the simulation controller 5 judges whether or not all initial input parameter value sets have been processed (step S113). When there is an unprocessed set, the processing returns to the step S109. On the other hand, when all sets have been processed, the processing shifts to a processing of FIG. 31 through a terminal B.

Figure 31:
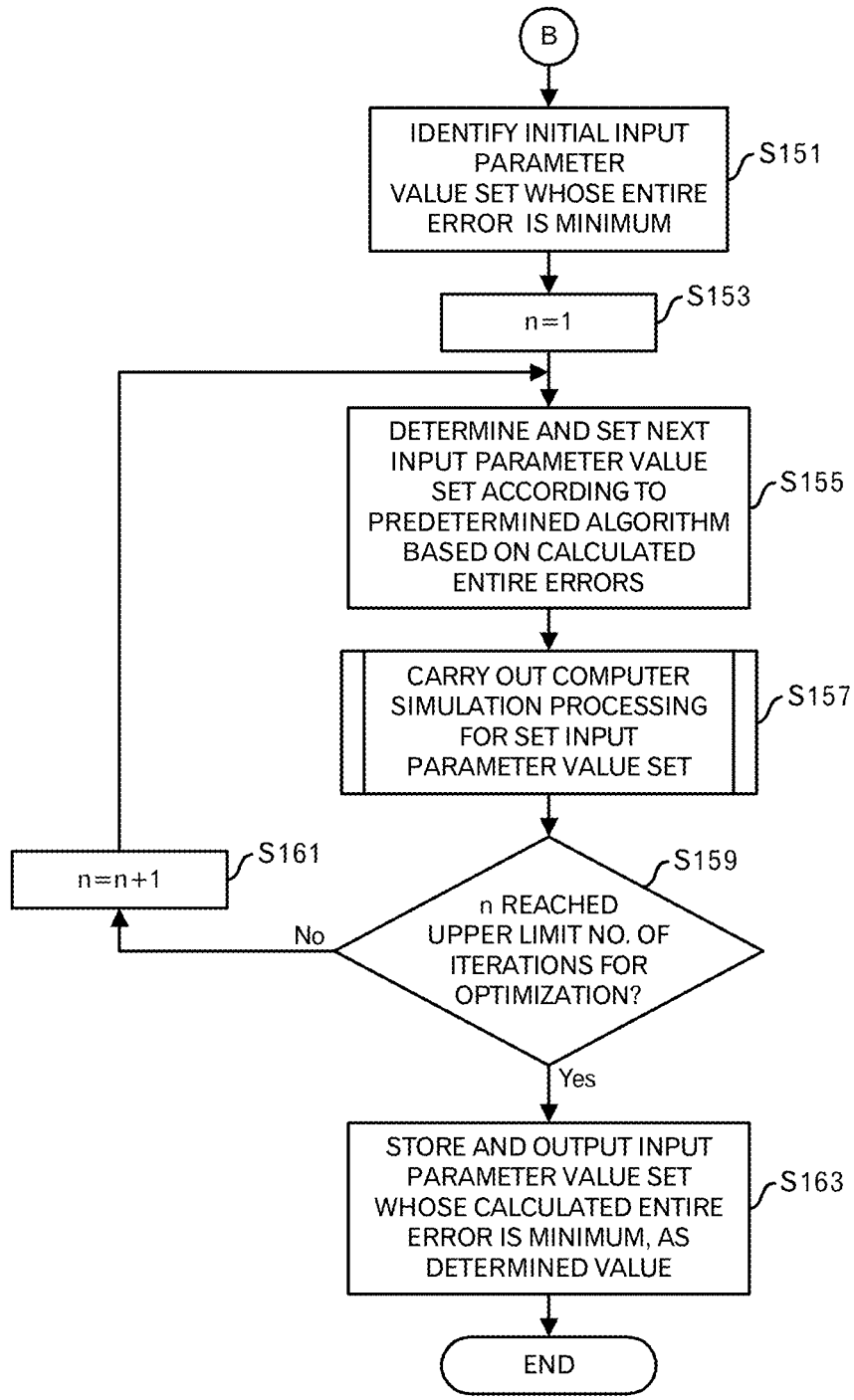
FIG. 31 is a diagram depicting a main processing flow in the embodiment 4.

Shifting to explanation of the processing of FIG. 31, the input parameter value identifying unit 12 identifies an initial input parameter value set whose entire error is minimum and which is stored in the entire error data storage 11 (step S151). Incidentally, not only the initial input parameter value set whose entire error is minimum but also the initial input parameter value sets whose entire error is a second value or third value in an ascending order of the entire errors may be identified. Thus, the initial value is identified on the optimization of the input parameter value set.

Incidentally, also in this embodiment, such a processing to generate a next input parameter value set is carried out by using an optimization algorithm such as a Brent method, Nelder-Mead method, Powell method, steepest descent method, conjugate gradient method, genetic algorithm, simulated annealing method, evolutionary algorithm, particle swarm optimization method or the like.

Then, the input parameter value identifying unit 12 sets "1" to a counter n (step S153), determines the next input parameter value set according to the aforementioned predetermined algorithm based on the calculated entire errors, and sets the next input parameter value set to the simulation controller 5 (step S155). After that, the simulation controller 5 and the like carry out the computer simulation processing for the set input parameter value set (step S157). This processing is the same as the processing at the step S111, although the input parameter value set is different. Therefore, the detailed explanation of the processing is omitted.

The simulation controller 5 notifies the input parameter value identifying unit 12 of the processing completion, and the input parameter value identifying unit 12 judges whether or not the counter n reaches the upper limit number of iterations for the optimization, which is stored in the setting data storage 2 (step S159). When the counter n does not reach the upper limit number of iterations for optimization, the counter n is incremented by "1" (step S161), and the processing return to the step S155. On the other hand, when the counter n reached the upper limit number of iterations for the optimization, the input parameter value identifying unit 12 identifies an input parameter value set whose value of the entire error is minimum and which is stored in the entire error data storage 11, and stores the identified input parameter value set as the determined values into the output data storage 13. The output unit 14 outputs the input parameter value set stored in the output data storage 13 to the output apparatus (e.g. printer, display apparatus, other computers connected to the network, or the like) (step S163).

By carrying out such a processing, in the embodiment, after the error is evaluated according to the dispersion of the actual measurement values, the input parameter value set whose entire error obtained from the error is minimum can be identified. Namely, when carrying out the following computer simulation by using such an input parameter value set, it becomes possible to execute the simulation in which the entire error is small.

Embodiment 5

The error function is not limited to that in the fourth embodiment, and the error function similar to the function in the second embodiment may be adopted.

Entire error=Σ{|calculated output variable value−actually measured output variable value|/standard deviation}$^2$/(the number of combinations of input variable values)

Incidentally, "Σ" represents a sum for all combinations of the input variable values.

Thus, the error is evaluated based on what times the standard deviation representing the dispersion of the actual measurement values is the error.

In the following, portions different from the fourth embodiment will be explained. Specifically, the entire error calculation processing (FIG. 30) is replaced with a processing depicted in FIG. 32. Incidentally, the functions of the input parameter value set identifying apparatus are the same as those in the fourth embodiment except the portions depicted in FIG. 32. Therefore, the same reference numbers as those depicted in FIG. 8 are used.

Figure 32:
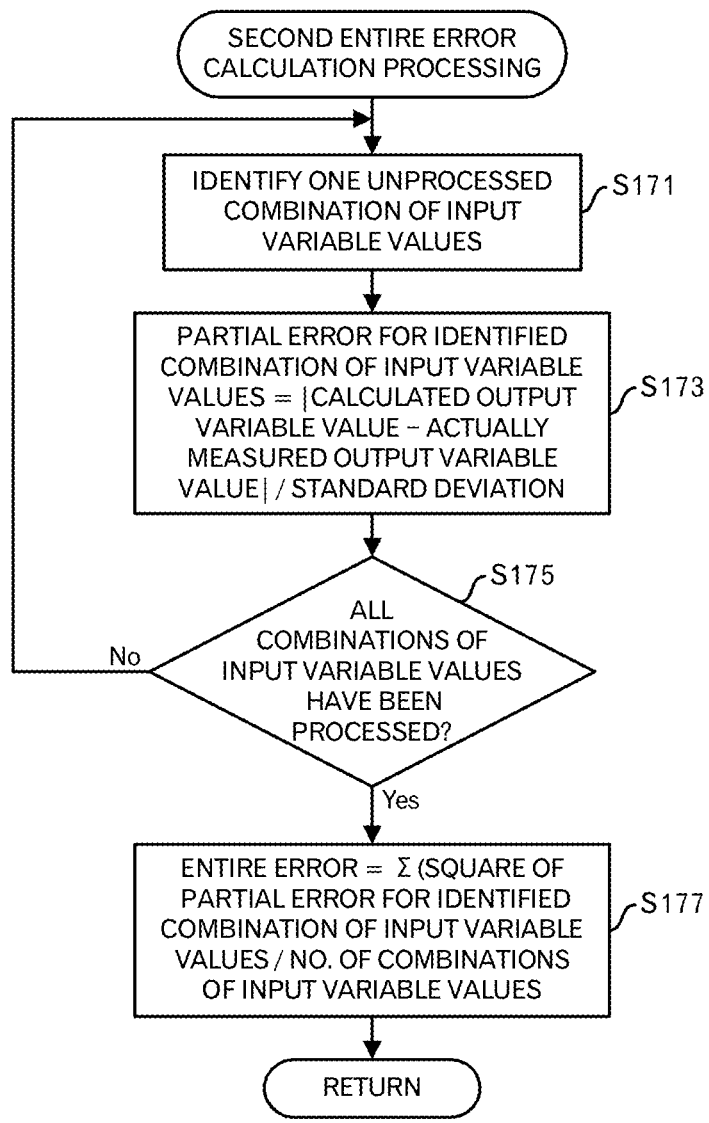
FIG. 32 is a diagram depicting a processing flow of the entire error calculation processing in embodiment 5.

In FIG. 32, the entire error calculation unit 10 identifies one unprocessed combination of the input variable values in the calculated value data storage 9 (step S171). Then, the entire error calculation unit 10 calculates a partial error for the identified combination of the input variable value by {|calculated output variable value−actually measured output variable value|/standard deviation}, and stores the partial error into the storage device such as the main memory (step S173). The standard deviation in the expression is the standard deviation for the combination of the input variable values, which was identified at the step S171, and is readout from the standard deviation storage 8. Because the consideration of this expression is the same as that in the second embodiment, the detailed explanation is omitted.

Then, the entire error calculation unit 10 judges whether or not all combinations of the input variable values in the calculated value data storage 9 have been processed (step S175). When there is an unprocessed combination, the processing returns to the step S171.

On the other hand, when all combinations have been processed, the entire error calculation unit 10 calculates an entire error by Σ(square of partial error for identified combination of input variable values/the number of combinations of input variable values), and stores the entire error into the entire error data storage 11 (step S177). "Σ" represents a sum for all combinations of the input variable values. When such a processing is carried out, the processing returns to the calling source processing.

As described above, the error function may be changed.

Embodiment 6

The error function is not limited to the function used in the fourth and fifth embodiments, and an error function similar to the function in the third embodiment may be adopted.

Entire error=1−exp{−Σ{|calculated output variable value−actually measured output variable value|/standard deviation}$^2$/(the number of combinations of input variable values)}

Incidentally, "Σ" represents a sum for all combinations of the input variable values. The partial error is the same as that in the fifth embodiment. The background of adopting such an expression is the same as that in the third embodiment.

In the following, portions different from the fourth embodiment will be explained. Specifically, the entire error calculation processing (FIG. 30) is replaced with a processing depicted in FIG. 33. Incidentally, the functions of the input parameter value set identifying apparatus are the same as those in the fourth embodiment except portions depicted in FIG. 33. Therefore, the same reference numbers as those depicted in FIG. 8 are used.

Figure 33:
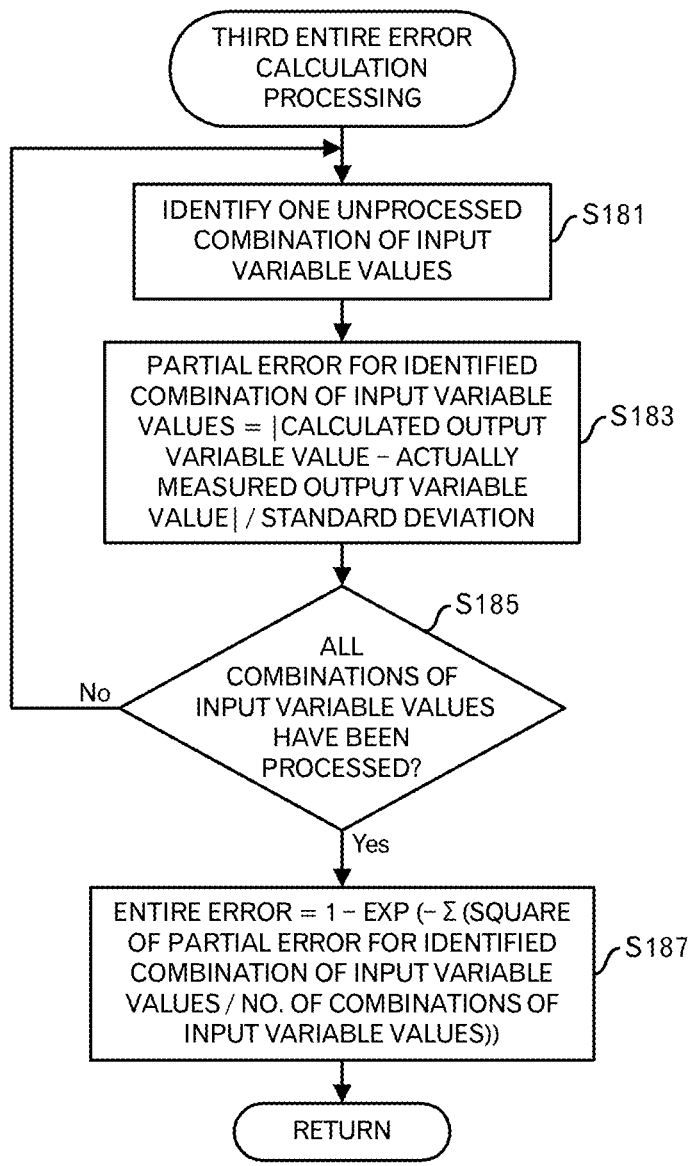
FIG. 33 is a diagram depicting a processing flow of the entire error calculation processing in embodiment 6.

In FIG. 33, the entire error calculation unit 10 identifies one unprocessed combination of the input variable values in the calculated value data storage 9 (step S181). Then, the entire error calculation unit 10 calculates a partial error for the identified combination of the input variable value by |calculated output variable value−actually measured output variable value|/standard deviation, and stores the partial error into the storage device such as the main memory (step S183). The standard deviation in the expression is the standard deviation for the combination of the input variable values, which was identified at the step S181, and is readout from the standard deviation storage 8. Because the consideration of the expression is the same as that in the second embodiment, the detailed explanation is omitted.

Then, the entire error calculation unit 10 judges whether or not all combinations of the input variable values in the calculated value data storage 9 have been processed (step S185). When there is an unprocessed combination, the processing returns to the step S181.

On the other hand, when all combinations have been processed, the entire error calculation unit 10 calculates an entire error by {1−exp{−(Σ(square of identified combination of input variable values/the number of combinations of input variable values))}}, and stores the entire error into the entire error data storage 11 (step S187). "Σ" represents a sum for all combinations of the input variable values. When such a processing is carried out, the processing returns to the calling source processing.

As described above, the format of the error function may be changed.

Embodiment 7

Figure 34:
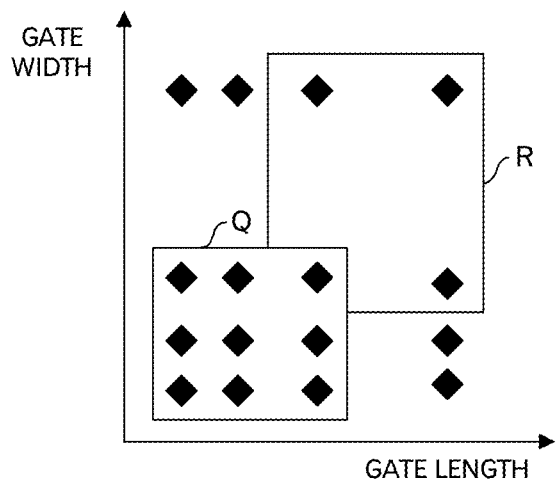
FIG. 34 is a diagram to explain the density of the input variable values in embodiments 7 and 8.

In the aforementioned embodiments, the standard deviation is calculated from the actual measurement values and used. However, after taking into consideration, the dispersion of the actual measurement values, the input variable values may be set. For example, in FIG. 34, the horizontal axis represents a logarithmic value of the gate length as the input variable, and vertical axis represents a logarithmic value of the gate width as the input variable. The points in FIG. 34 correspond to combinations of the gate length and gate width. As depicted in FIG. 34, the density dispersion of the points set on such a plane appears. This is because, in a lower left region Q in which the gate length and gate width are short, the voltage−electric current characteristic is complicated, the measurement error occurs because of the small transistors, and the dispersion of the actual measurement values appears. Namely, in order to accurately set the input parameter value sets, it is preferable that a lot of combinations of the gate length and gate width are set in the region Q to obtain a lot of actual measurement values. On the other hand, in an upper right region R in which the gate length and gate width are long, the voltage−electric current characteristic is simple and the measurement is easy compared with a case of the region Q. Therefore, the measurement can be carried out accurately. Accordingly, there is no need to set a lot of combinations of the gate length and gate width in the region Q and obtain a lot of actual measurement values.

Thus, in a situation that the input variable values are set after taking into consideration the dispersion of the actual measurement values, when the weight of the error function is set according to the roughness and fineness of the points corresponding to the combinations of the input variable values in the input variable space, it becomes possible to set the weight in a form that the dispersion of the actual measurement values is considered indirectly.

Figure 35:
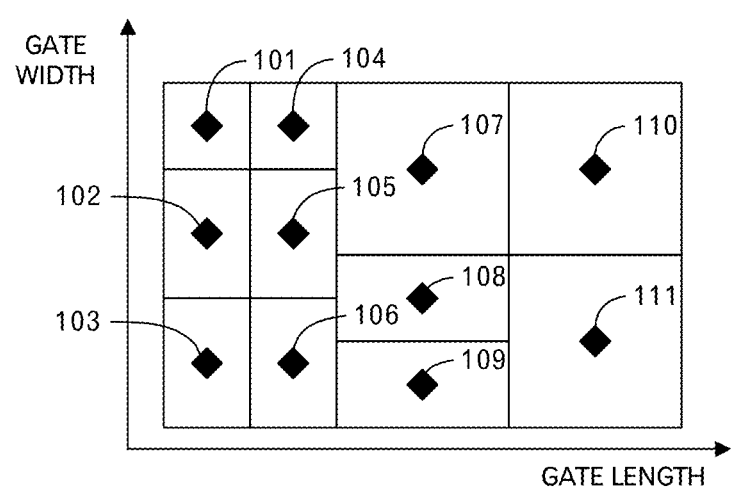
FIG. 35 is a diagram to explain a calculation method of the weight in the embodiment 7.

In the seventh embodiment, as depicted in FIG. 35, a largest rectangle in which a target point is included but other points are not included is generated in the same plane as that in FIG. 34. For example, each point is handled as a center, vertical left and right sides are moved in a horizontal direction away from the center, and simultaneously, the horizontal top and bottom sides are moved in a vertical direction away from the center. Then, because the side touches another side of other adjacent points, upper limit or lower limit sooner or later, the movement of the side in the horizontal direction or the vertical direction is terminated at that timing. In the example of FIG. 34, when the top sides of the points 101 and 104 reach the upper limit of the gate width, the movement of the top and bottom side is stopped. In addition, when the right side of the point 101 touches the left side of the point 104, the movement of the left and right sides is stopped. Similarly, when the right side of the point 102 touches the left side of the point 105, the movement of the left and right sides is stopped. In addition, the bottom sides of the points 102 and 105 touch the top sides of the points 103 and 106, the movement of the top and bottom sides is stopped. Furthermore, when the bottom side of the point 108 touches the top side of the point 109, the movement of the top and bottom side is stopped. Moreover, when the right sides of the points 107 and 109 touch the left sides of the points 110 and 111, the movement of the left and right sides is stopped. Thus, it is possible to equally obtain, for each point, the maximum rectangle, which includes the target point but does not include other points.

Then, in this embodiment, the area of the rectangle obtained for each point is used as the weight.

Figure 36:
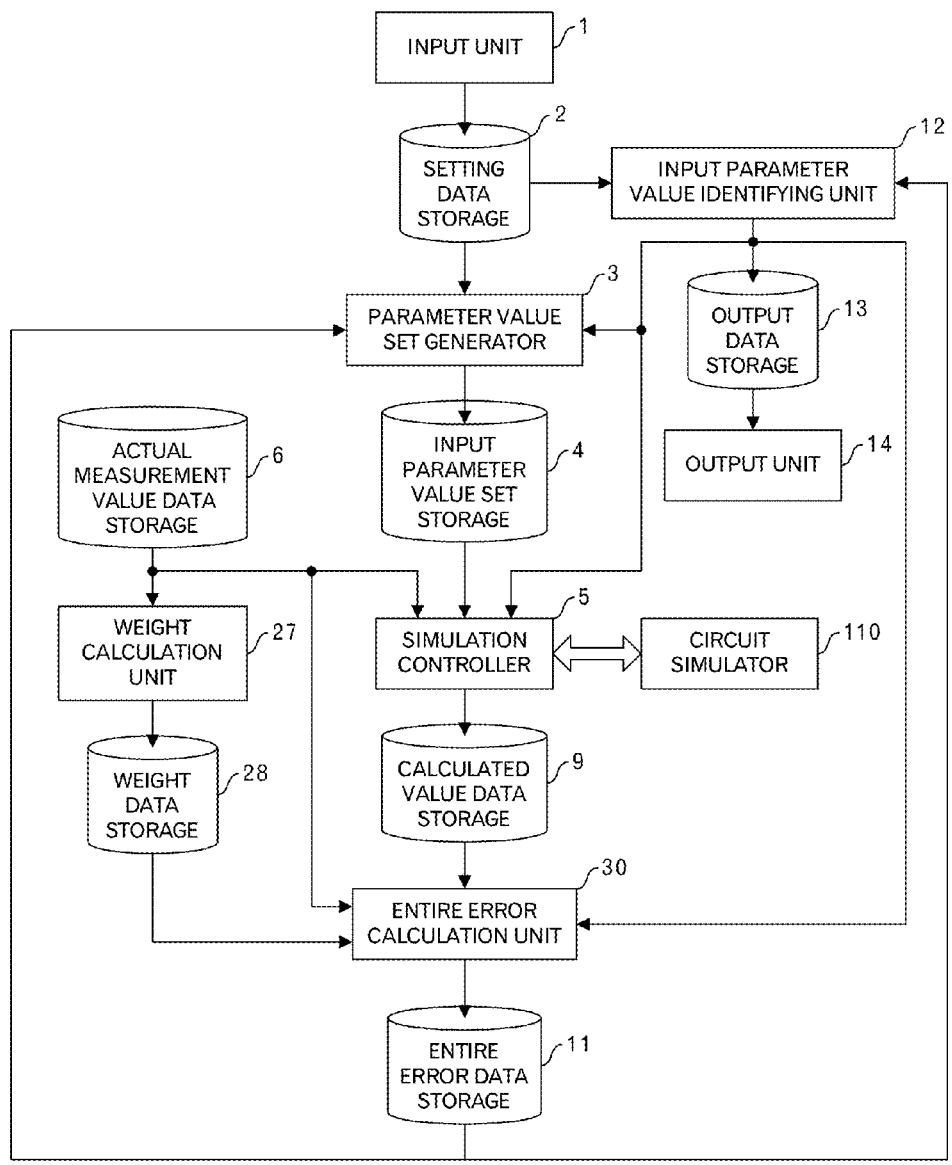
FIG. 36 is a functional block diagram of the input parameter value set identifying apparatus in the embodiment 7.

Specifically, an input parameter value set identifying apparatus relating to this embodiment has a configuration as depicted in FIG. 36. Namely, the input parameter value set identifying apparatus has (A) an input unit 1 to accept inputs of setting data; (B) a setting data storage 2 storing the setting data accepted by the input unit 1; (C) a parameter value set generator 3 to carry out a processing using data stored in the setting data storage 2 and the like; (D) an input parameter value set storage 4 storing data generated by the parameter value set generator 3; (E) an actual measurement value data storage 6 storing actually measured output variable values; (F) a weight calculation unit 27 to carry out a processing by using data stored in the actual measurement value data storage 6; (G) a weight data storage 28 storing data of the weight calculated by the weight calculation unit 27; (H) a simulation controller 5 to carry out a processing by using data stored in the actual measurement value data storage 6 and input parameter value set storage 4; (I) a calculated value data storage 9 storing simulation results obtained by the simulation controller 5; (J) an entire error calculation unit 30 to carry out a processing by using data stored in the actual measurement value data storage 6, the weight data storage 28 and the calculated value data storage 9; (K) an entire error data storage 11 storing processing results of the entire error calculation unit 30; (L) an input parameter value identifying unit 12 to carry out a processing by using data stored in the setting data storage 2 and the entire error data storage 11; (M) an output data storage 13 storing the input parameter value set finally identified by the input parameter value identifying unit 12; and (N) an output unit 14 data stored in the output data storage 13 to an output device (e.g. printer, display apparatus or the like) or other computers. Thus, the weight calculation unit 27, weight data storage 28 and entire error calculation unit 30 are different from FIG. 8. However, other elements carry out almost the same processing. Therefore, the same reference numbers are used for those elements.

The input parameter value identifying unit 12 carries out a processing to control the parameter value set generator 3, the simulation controller 5 and the entire error calculation unit 30. The simulation controller 5 causes the circuit simulator 110 such as SPICE simulator to carryout the simulation for the input variable value sets and the input parameter value sets, and obtains results of the simulation as the output variable values. The parameter value set generator 3 generates the input parameter value sets used in the next iteration processing based on the values of the entire error, which are stored in the entire error data storage 11 according to a predetermined algorithm. Incidentally, the parameter value set generator 3 also generates initial input parameter value sets. In addition, the simulation controller 5 communicates with the input parameter value identifying unit 12.

The actual measurement value data storage 6 stores data in the format depicted in FIG. 9, for example, similarly to the first embodiment.

Next, processing contents of the input parameter value set identifying apparatus relating to this embodiment will be explained by using FIGS. 37 to 43. First, the input unit 1 prompts the user to input the number of initial input parameter value sets to be generated, accepts the input of the number of sets from the user, and stores the inputted data into the setting data storage 2 (step S201). In addition, the input unit 1 prompts the user to input the upper limit number of iterations for the optimization carried out in the following, accepts the upper limit number of iterations from the user, and stores the inputted data into the setting data storage 2 (step S203). Incidentally, the input unit 1 may prompt the user to input the actual measurement value data, accept the input of the actual measurement value data, and store the actual measurement value data into the actual measurement value data storage 6. In addition, a file including the actual measurement value data is obtained from other computers, and is stored into the actual measurement value data storage 6.

Figures 38, 39:
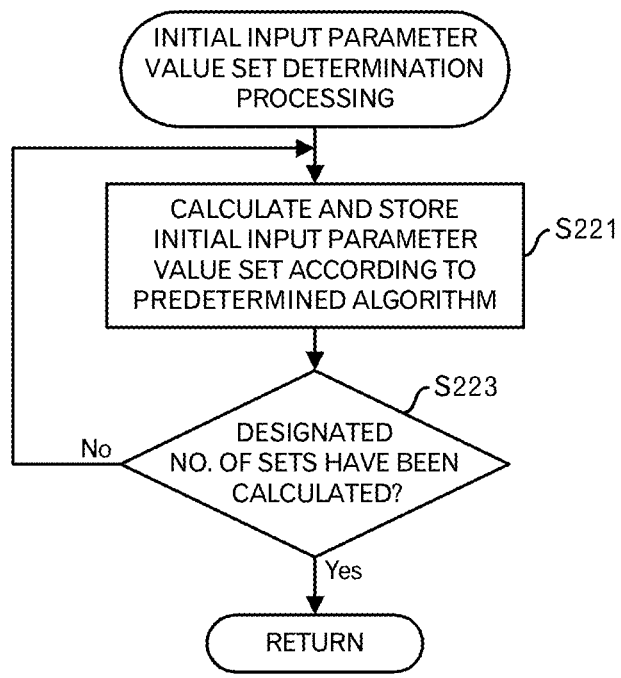
FIG. 38 is a diagram depicting an example of data stored in a weight data storage.
FIG. 39 is a diagram to explain the initial input parameter value set determination processing in the embodiment 7.

In addition, the weight calculation unit 27 arranges points corresponding to all combinations of the gate length and gate width, which are stored in the actual measurement value data storage 6, in a plane mapped by a horizontal axis representing the logarithmic value of the gate length and a vertical axis representing the logarithmic value of the gate width, identifies, for each combination of the gate length and gate width, a covering largest rectangle, calculates an area of the covering largest rectangle, and stores the area as the weight into the weight data storage 28 (step S205). The covering largest rectangle is identified by the aforementioned method depicted in FIG. 35, for example, and its area is calculated. For example, data as depicted in FIG. 38 is stored into the weight data storage 28. In an example of FIG. 38, for each combination of the gate length and gate width, the weight is registered.

Then, the input parameter value identifying unit 12 instructs the parameter value set generator 3 to carry out a processing, and the parameter value set generator 3 carries out an initial input parameter value set determination processing according to the instruction (step S207). The initial input parameter value set determination processing will be explained by using FIG. 39.

In the processing of FIG. 39, the parameter value set generator 3 calculates the initial input parameter value sets according to a predetermined algorithm, and stores the calculated data into the input parameter value set storage 4 (step S221). Because of the initial values, there is no problem even if calculation is carried out in any method. However, the initial values are calculated within value ranges of the input parameters, for each of the input parameters, according to a method such as a random sampling. The input parameter value set storage 4 stores data as depicted in FIG. 13, for example.

Then, the parameter value set generator 3 judges whether or not the designated number of input parameter value sets have been generated (step S223). When the designated number of input parameter value sets have not been generated, the processing returns to the step S221. On the other hand, when the designated number of input parameter value sets have been generated, the processing returns to the calling source processing.

Figure 37:
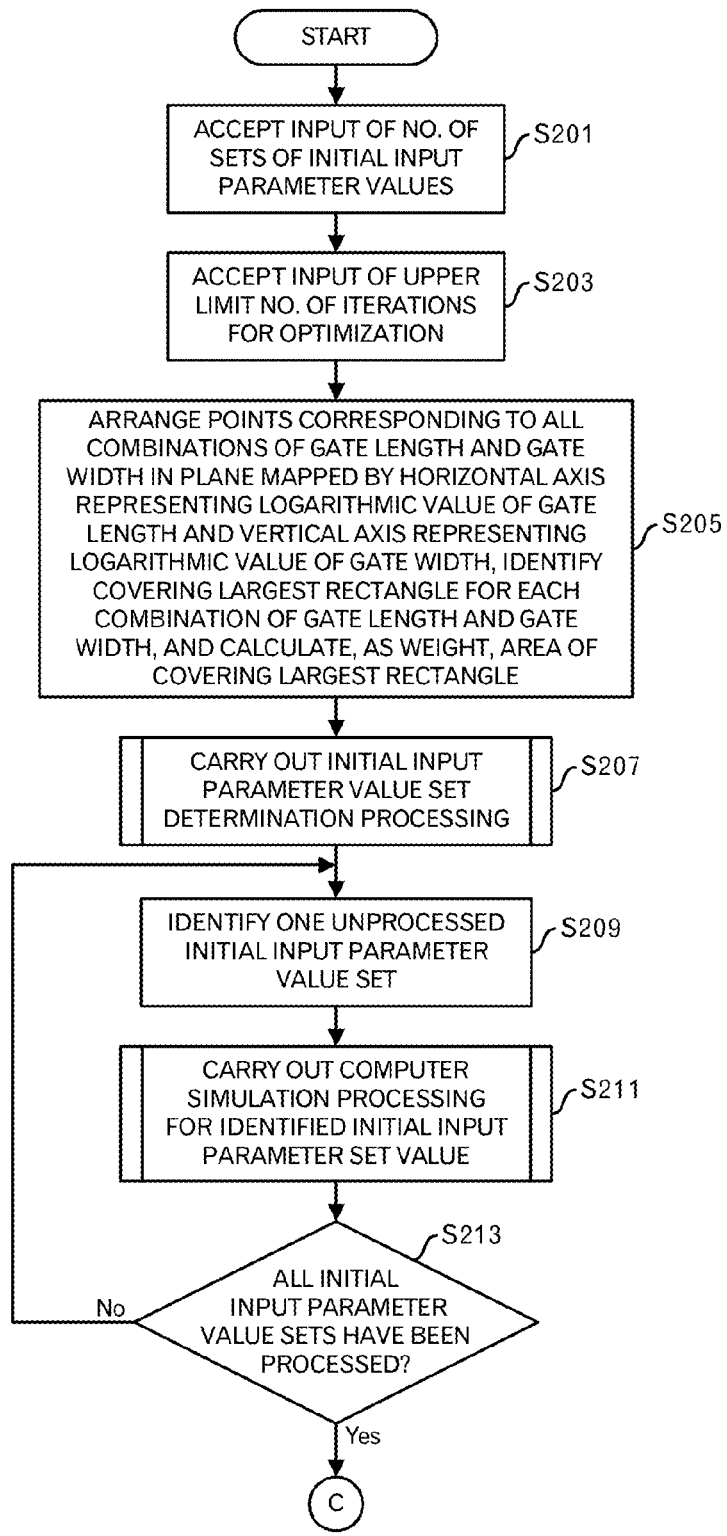
FIG. 37 is a diagram depicting a main processing flow in the embodiment 7.

Returning to the explanation of the processing in FIG. 37, the input parameter value identifying unit 12 instructs the simulation controller 5 to carry out a processing, and the simulation controller 5 identifies one unprocessed initial input parameter value set stored in the input parameter value set storage 4 according to the instruction (step S209). Then, the simulation controller 5 and the like carry out a computer simulation processing for the identified initial input parameter value set (step S211). The computer simulation processing for the identified initial input parameter value set will be explained by using FIG. 40.

Figure 40:
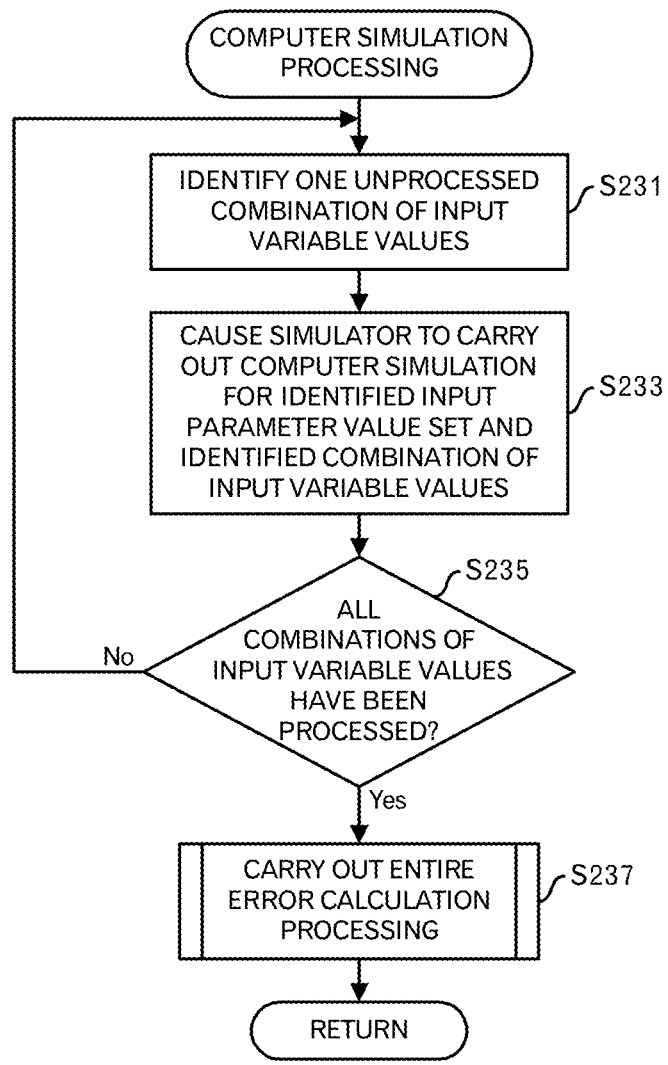
FIG. 40 is a diagram depicting the computer simulation processing in the embodiment 7.

In the processing of FIG. 40, the simulation controller 5 identifies one unprocessed combination of the input variable values (here, gate length, gate width and voltage value) in the actual measurement value data storage 6 (step S231). Then, the simulation controller 5 causes the circuit simulator 110 to carryout the computer simulation for the input parameter value set identified at the upper-level processing of this processing and the combination of the input variable values, which was identified at the step S231, obtains the calculated electric current value that is an output variable value from the circuit simulator 110, and stores the obtained data into the calculated value data storage 9 (step S233). The computer simulation is the same as the conventional one. Therefore, further explanation is omitted. The calculated value data storage 9 stores data as depicted in FIG. 15, for example.

Then, the simulation controller 5 judges whether or not all combinations of the input variable values stored in the actual measurement value data storage 6 have been processed (step S235). When there is unprocessed combination, the processing returns to the step S231. On the other hand, when all combinations of the input variable values have been processed, the simulation controller 5 notifies, for example, the input parameter value identifying unit 12 of processing completion, and after that, the input parameter value identifying unit 12 instructs the entire error calculation unit 30 to carry out the processing. Then, the entire error calculation unit 30 carries out an entire error calculation processing (step S237). This entire error calculation processing will be explained by using FIG. 41. Incidentally, when the entire error calculation processing is completed, the processing returns to the calling source processing.

Figure 41:
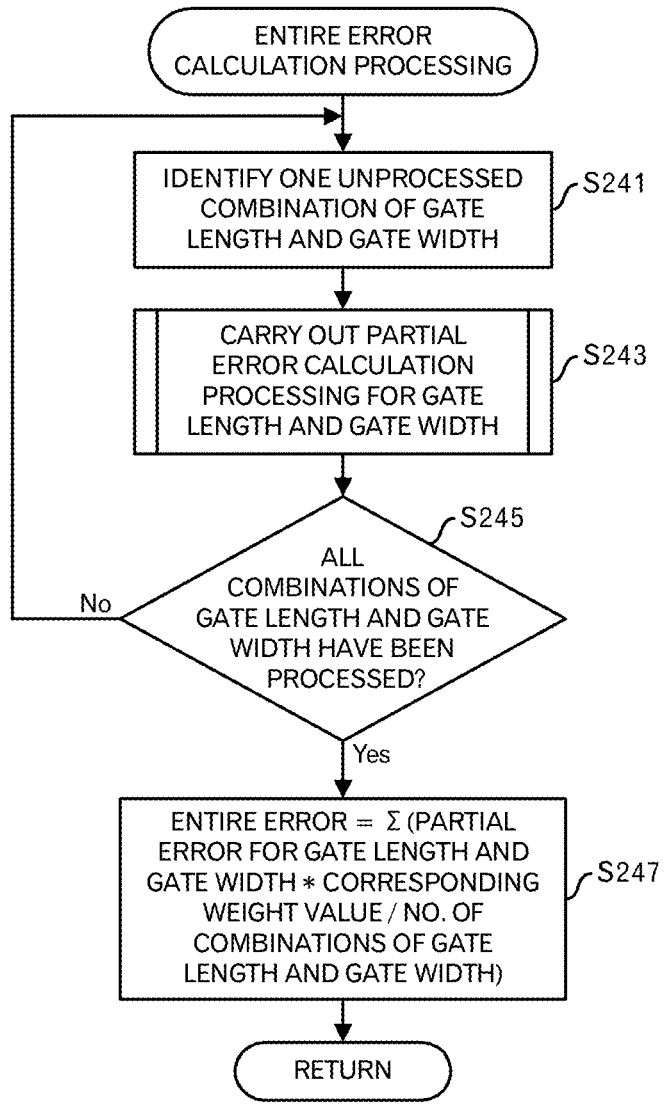
FIG. 41 is a diagram depicting the entire error calculation processing in the embodiment 7.

In the processing of FIG. 41, the entire error calculation unit 30 identifies one unprocessed combination of the gate length and gate width in the calculated value data storage 9 (step S241). Then, the entire error calculation unit 30 carries out a partial error calculation processing for the gate length and gate width (step S243). The partial error calculation processing relating to this embodiment will be explained by using FIG. 42.

Figure 42:
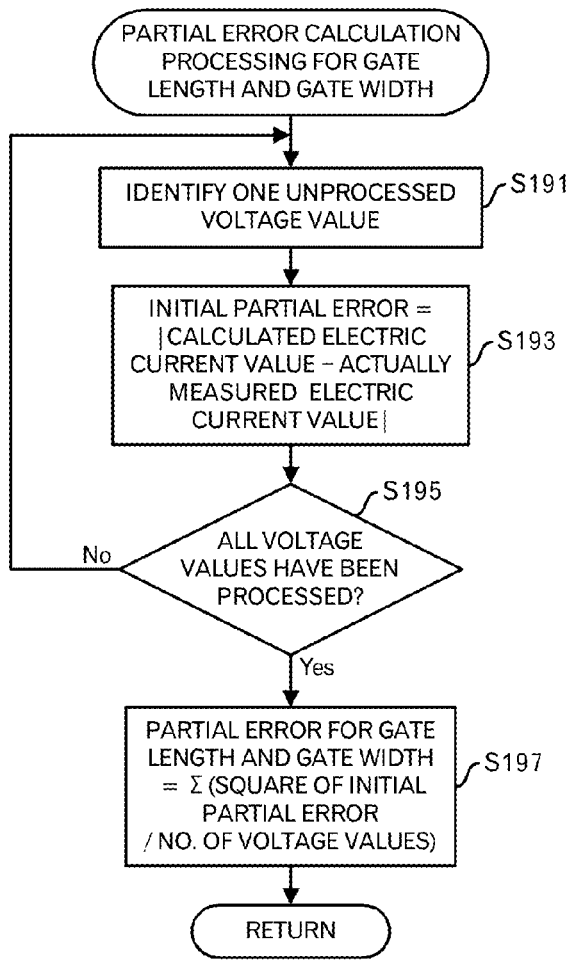
FIG. 42 is a diagram depicting the partial error calculation processing for the gate length and gate width in the embodiment 7.

In FIG. 42, the entire error calculation unit 30 identifies one unprocessed voltage value in the calculated value data storage 9 (step S191). Then, the entire error calculation unit 30 calculates an initial partial error by |calculated electric current value−actually measured electric current value|, and stores the partial error into a storage device such as a main memory (step S193). Then, the entire error calculation unit 30 judges whether or not all of the voltage values in the calculated value data storage 9 have been processed (step S195). When there is an unprocessed voltage value, the processing returns to the step S191.

On the other hand, when all of the voltage values have been processed, the entire error calculation unit 30 calculates a partial error for the gate length and gate width by Σ(square of initial partial error/the number of voltage values), and stores the partial error into the storage device such as the main memory (step S197). "Σ" means a sum for all voltage values. When such a processing is carried out, the processing returns to the calling source processing.

Returning to the explanation of the processing in FIG. 41, the entire error calculation unit 30 judges whether or not all combinations of the gate length and gate width have been processed in the calculation value data storage 9 (step S245). When there is an unprocessed combination, the processing returns to the step S241. On the other hand, when all of the combinations have been processed, the entire error calculation unit 30 calculates an entire error by Σ(partial error for gate length and gate width*corresponding weight value/the number of combinations of gate length and gate width), and stores the calculated value of the entire error into the entire error data storage 11 in association with the input parameter value set (step S247). "Σ" represents a sum for all combinations of the gate length and gate width. The weight value in the expression is a weight value for the combination of the gate length and gate width.

Incidentally, at the step S247, the partial error for the gate length and gate width is multiplied by the weight value. Also at the step S197, (square of the partial error for all of the input variable values) may be multiplied by the weight value.

The entire error data storage 11 stores data as depicted in FIG. 17B, for example.

When such a processing is carried out, the processing returns to the processing of FIG. 37. Then, the simulation controller 5 judges whether or not all initial input parameter value sets have been processed (step S213). When there is an unprocessed set, the processing returns to the step S209. On the other hand, when the entire sets have been processed, the processing shifts to a processing of FIG. 43 through a terminal C.

Figure 43:
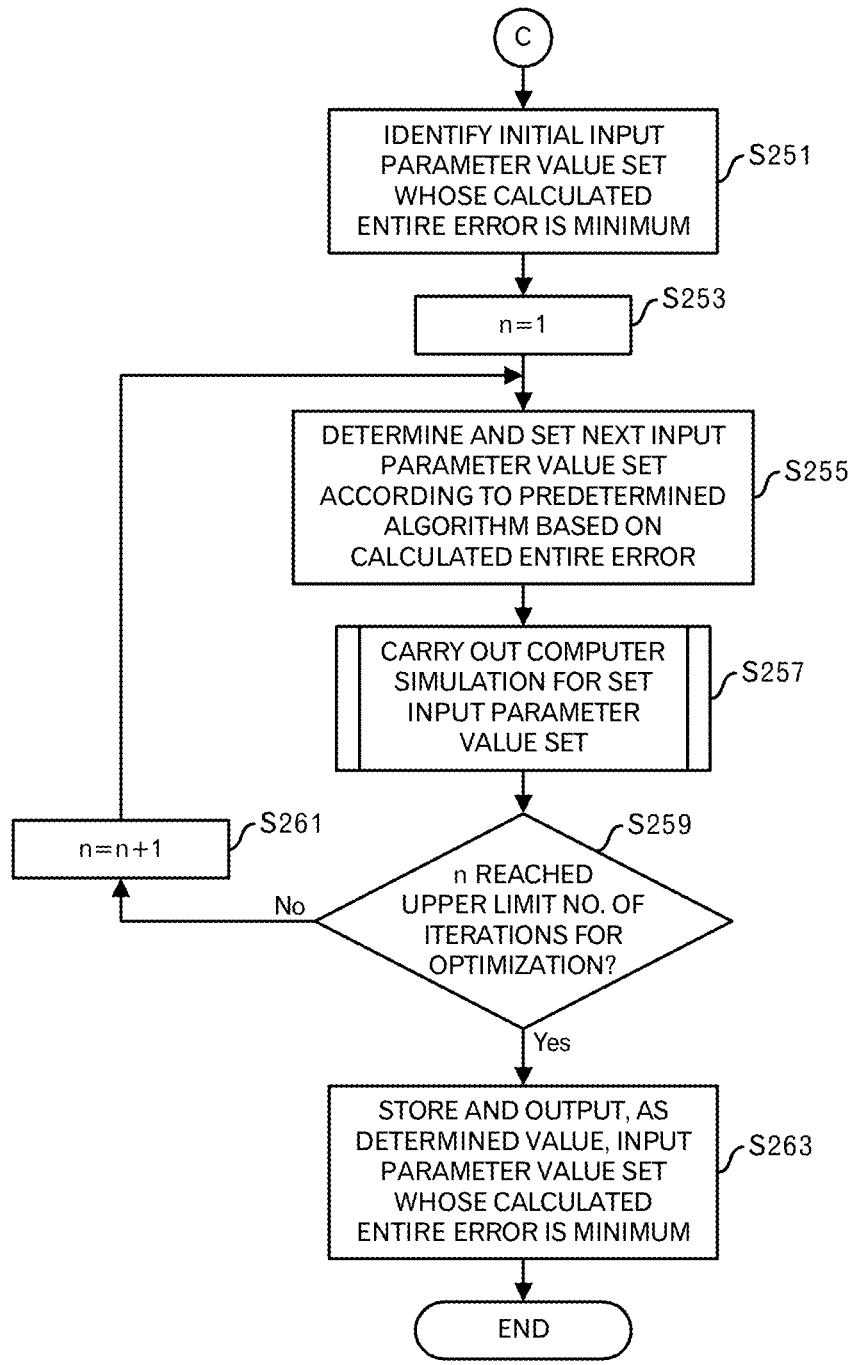
FIG. 43 is a diagram depicting a main processing flow in the embodiment 7.

Shifting to explanation of the processing of FIG. 43, the input parameter value identifying unit 12 identifies an initial input parameter value set whose entire error is minimum and which is stored in the entire error data storage 11 (step S251). Incidentally, not only the initial input parameter value set whose entire error is minimum but also the initial input parameter value sets whose entire error is a second value or third value in an ascending order of the entire errors may be identified. Thus, the initial value is identified on the optimization of the input parameter value set.

Incidentally, also in this embodiment, such a processing to generate next input parameter value sets is carried out by using a well-known method such as a Brent method Nelder-Mead method, Powell method, steepest descent method, conjugate gradient method, genetic algorithm, simulated annealing method, evolutionary algorithm, particle swarm optimization method or the like.

Then, the input parameter value identifying unit 12 sets "1" to a counter n (step S253), determines the next input parameter value set according to the aforementioned predetermined algorithm, and sets the determined next input parameter value set into the simulation controller 5 (step S255). Then, the simulation controller 5 and the like carry out the computer simulation processing for the input parameter value set, which was set at the step S255 (step S257). This processing is the same as the processing at the step S211, although the input parameter value set is different. Therefore, the detailed explanation of the processing is omitted.

The simulation controller 5 notifies the input parameter value identifying unit 12 of the processing completion, and the input parameter value identifying unit 12 judges whether or not "n" reaches the upper limit number of iterations for the optimization, which is stored in the setting data storage 2 (step S259). When "n" does not reach the upper limit number of iterations for optimization, the simulation controller 5 increments "n" by "1" (step S261), and the processing returns to the step S255. On the hand, when "n" reaches the upper limit number of iterations for optimization, the input parameter value identifying unit 12 identifies an input parameter value set whose entire error is minimum and which is stored in the entire error data storage 11, and stores the identified input parameter value set, as the determined value, into the output data storage 13. The output unit 14 outputs the input parameter value set stored in the output data storage 13 to the output apparatus (e.g. printer, display apparatus or other computers connected to the network) (step S263).

By carrying out such a processing, the weight value is set according to the density of the combinations of the input variable values, which are set according to the dispersion of the actual measurement values. Accordingly, an appropriate parameter value set can be identified automatically and objectively.

Incidentally, in the seventh embodiment, the error function can be represented as follows:

$$\text{Entire error} = \Sigma_1 \Sigma_2 \{|\text{calculated electric current value} - \text{actually measured electric current value}|^2 * \text{weight value for gate length and gate width}\} / \{(\text{the number of voltage values}) * (\text{the number of combinations of gate length and gate width})\}$$

Incidentally, "$\Sigma_2$" represents a sum for all voltage values in a specific combination of the gate length and gate width, and "$\Sigma_1$" represents a sum for all combinations of the gate length and gate width.

Embodiment 8

Figure 44:
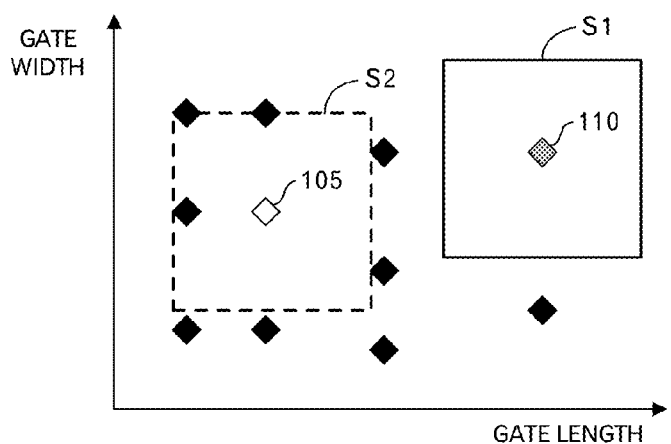
FIG. 44 is a diagram to explain a calculation method of the weight in the embodiment 8.

Other values can be adopted as the weight value, which is set according to the roughness and fineness of the input variable values. Namely, as depicted in FIG. 44, in a plane mapped by a horizontal axis representing the logarithmic value of the gate length and a vertical axis representing the logarithmic value of the gate width, points corresponding to the combinations of the input variable values are plotted. Then, the number of points included in a rectangle having a predetermined area and whose center is either of the points is counted. In the example of FIG. 44, the point included in the rectangle S1 is only the point 110 in case of the point 110. In addition, in case of the point 105, the number of points included in the rectangle S2 is 4. Thus, a lot of points are included in the rectangle in a region in which the points are arranged closely, and a few points are included in the rectangle in a region in which the points are arranged sparsely. Therefore, an inverse of the number of points is adopted as the weight value.

Incidentally, the configuration of the input parameter value set identifying apparatus relating to embodiment is the same as that in FIG. 36, although the processing contents described later are different.

Figure 45:
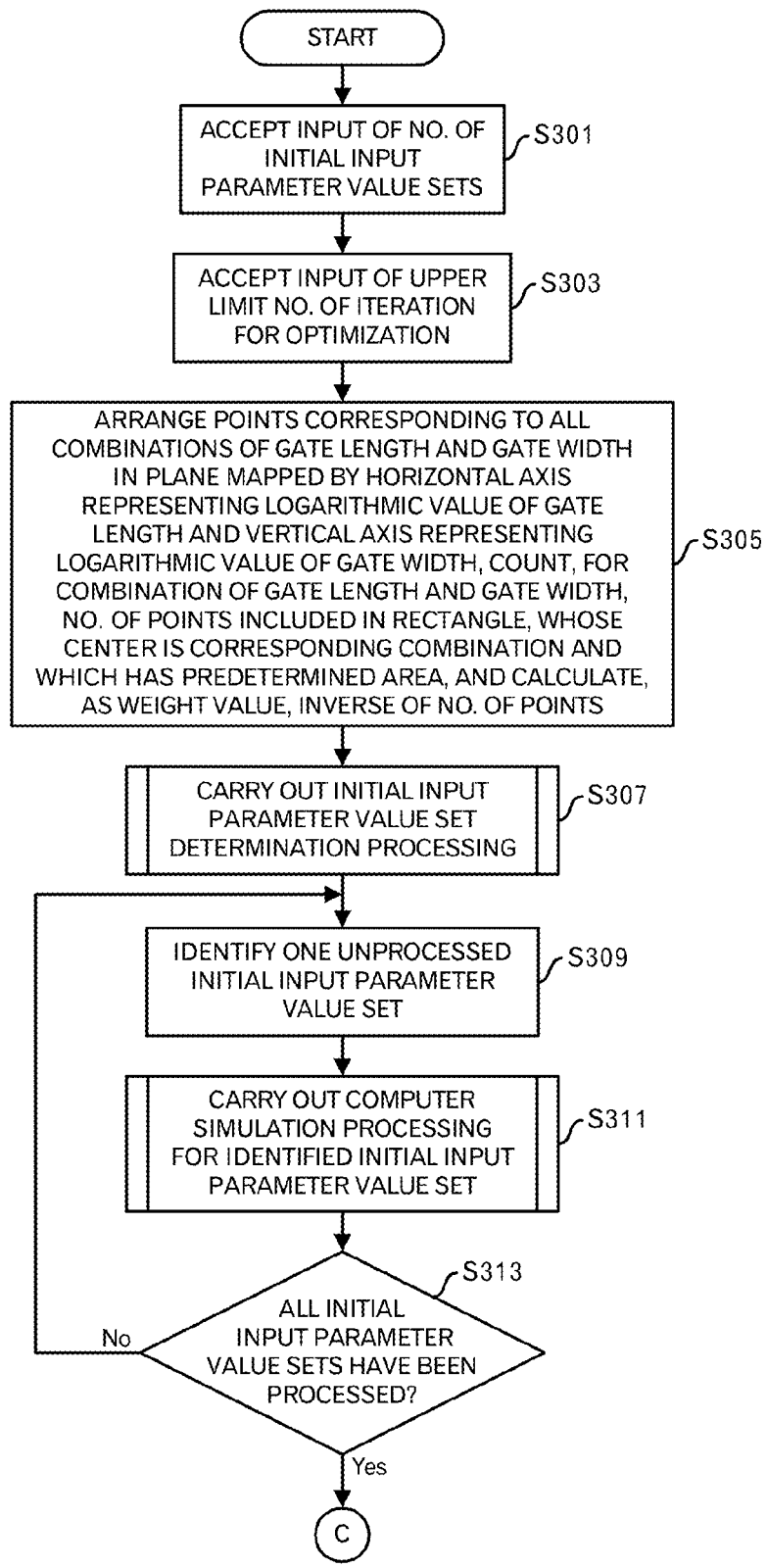
FIG. 45 is a diagram depicting a main processing flow of the embodiment 8.

Specifically, only portions different from the seventh embodiment will be explained by using FIG. 45.

First, the input unit 1 prompts the user to input the number of initial input parameter value sets to be generated, accepts the input of the number of sets from the user, and stores the inputted data into the setting data storage 2 (step S301). In addition, the input unit 1 prompts the user to input the upper limit number of iterations in the iteration processing for optimization, which will be carried out later, accepts the upper limit number of iterations from the user, and stores the inputted data into the setting data storage 2 (step S303). Incidentally, the input unit 1 may prompt the user to input the actual measurement value data, accept the input of the actual measurement value data, and store the inputted data into the actual measurement value data storage 6. Moreover, a file including the actual measurement value data may be obtained from other computers, and be stored into the actual measurement value data storage 6.

In addition, the weight calculation unit 27 arranges, for each combination of the gate length and gate width, a rectangle having a predetermined size in a plane, which is mapped by a horizontal axis representing the logarithmic value of the gate length and a vertical axis representing the logarithmic value of the gate width, and in which points corresponding to all combinations of the gate length and gate width, which are stored in the actual measurement value data storage 6, are arranged, and counts, for each combination of the gate length and gate width, the number of points included in the rectangle, and stores, as the weight value, an inverse of the number of points into the weight data storage 28 (step S305). The size of the rectangle is preferably set, for example, empirically.

Then, the input parameter value identifying unit 12 instructs the parameter value set generator 3 to carry out a processing, and the parameter value set generator 3 carries out an initial input parameter value set determination processing according to the instruction (step S307). The initial input parameter value set determination processing explained by using FIG. 39 is the same as in FIG. 39.

Then, the input parameter value identifying unit 12 instructs the simulation controller 5 to carry out a processing, and the simulation controller 5 identifies one unprocessed set among initial input parameter value sets stored in the input parameter value set storage 4 according to the instruction (step S309). Then, the simulation controller 5 and the like carry out a computer simulation processing for the identified initial input parameter value set (step S311). The computer simulation processing for the identified initial input parameter value set is the same as that explained by using FIG. 40.

Then, the simulation controller 5 judges whether or not all sets of the initial input parameter values have been processed (step S313). When there is an unprocessed set, the processing returns to the step S309. On the other hand, when all sets have been processed, the processing shifts to a processing of FIG. 43 through a terminal C. The subsequent processing is the same as that in the seventh embodiment.

Incidentally, in the eighth embodiment, the error function has the same format as that in the seventh embodiment, although the content of the weight value is different.

Although the embodiments of this technique were explained, this technique is not limited to those embodiments. For example, the aforementioned functional block diagram represents a mere example, and does not correspond to an actual program module configuration. The simulator 100 and circuit simulator 110 may not be included or may be included in the input parameter value set identifying apparatus.

Furthermore, as for the processing flow, as long as the processing results do not change, the order of the processing may be changed, and the steps may be executed in parallel.

In addition, although the input parameter value set identifying apparatus is implemented by a stand-alone type computer, plural computers connected with a computer network may cooperate with each other to carry out the aforementioned processing.

Figure 46:
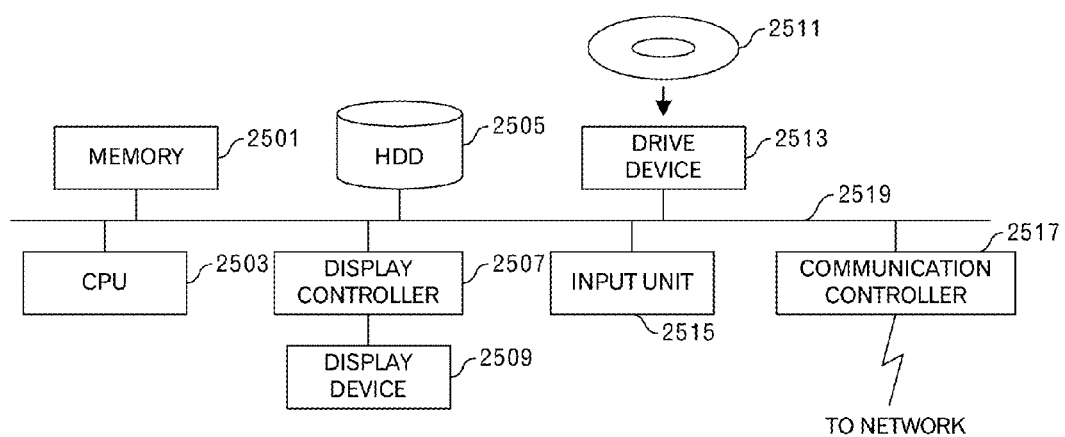
FIG. 46 is a functional block diagram of a computer.

In addition, the input parameter value set identifying apparatus is a computer device as shown in FIG. 46. That is, a memory 2501 (storage device), a CPU 2503 (processor), a hard disk drive (HDD) 2505, a display controller 2507 connected to a display device 2509, a drive device 2513 for a removable disk 2511, an input device 2515, and a communication controller 2517 for connection with a network are connected through a bus 2519 as shown in FIG. 46. An operating system (OS) and an application program for carrying out the foregoing processing in the embodiment, are stored in the HDD 2505, and when executed by the CPU 2503, they are read out from the HDD 2505 to the memory 2501. As the need arises, the CPU 2503 controls the display controller 2507, the communication controller 2517, and the drive device 2513, and causes them to perform necessary operations. Besides, intermediate processing data is stored in the memory 2501, and if necessary, it is stored in the HDD 2505. In this embodiment of this invention, the application program to realize the aforementioned functions is stored in the removable disk 2511 and distributed, and then it is installed into the HDD 2505 from the drive device 2513. It may be installed into the HDD 2505 via the network such as the Internet and the communication controller 2517. In the computer as stated above, the hardware such as the CPU 2503 and the memory 2501, the OS and the necessary application programs systematically cooperate with each other, so that various functions as described above in details are realized.

Figure 47:
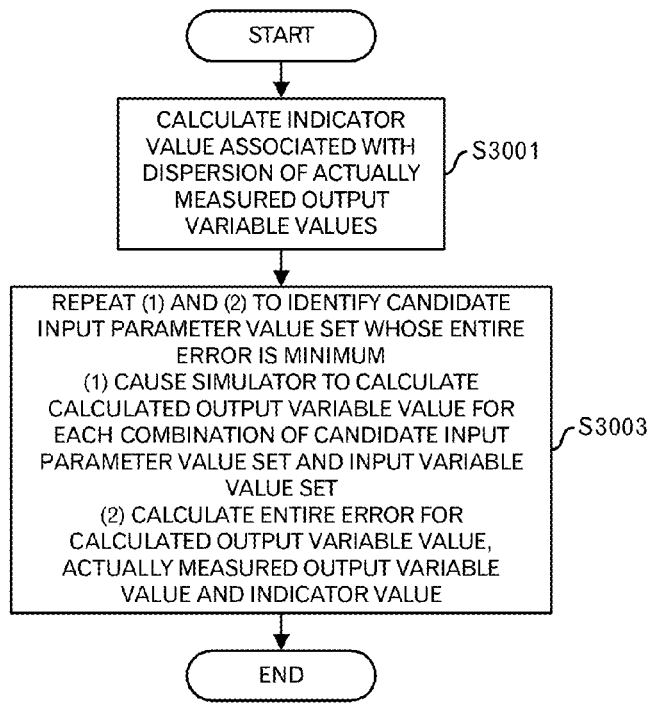
FIG. 47 is a diagram depicting a processing flow of the embodiments.

The aforementioned embodiments are outlined as follows:

An input parameter value set identifying method (depicted in FIG. 47) includes (A) calculating [S3001 in FIG. 47], for each of input variable value sets, which are set in advance, an indicator value associated with dispersion of actually measured output variable values from data stored in a first storage device, and storing the calculated indicator value into a second storage device, wherein the first storage device stores, for each of said input variable value sets, the actually measured output variable values; (B) repeating [S3003 in FIG. 47](1) a processing to cause a simulator for computing a calculated output variable value that is a calculated value of an output variable from a certain input parameter value set and a certain input variable value set to compute a calculated output variable value for each combination of one of candidate input parameter value sets and one of the input variable value sets, and (2) a processing to calculate, for each of said candidate input parameter value sets, (a) a first entire error that is a result obtained by taking into consideration, with respect to all of the input variable value sets, first partial errors obtained respectively by evaluating, by using the indicator value for a corresponding input variable value set, which is stored in the second storage device, a difference between the calculated output variable value and the actually measured output variable value for the corresponding input variable value set, which is stored in the first storage device, or (b) a second entire error that is a result obtained by taking into consideration, with respect to all of the input variable value sets, second partial errors, each of which is the difference, while weighting by using the indicator value for the corresponding input variable value set; (C) [S3003 in FIG. 47] identifying the candidate input parameter value set making the first or second entire error minimum, and storing the identified candidate input parameter value set into an output data storage device.

By introducing the indicator value associated with the dispersion of the actually measured output variable values, it becomes possible to evaluate the error corresponding to the dispersion of the actual values much objectively, and to identify an appropriate input parameter value set finally.

Incidentally, the aforementioned indicator value may be a value (e.g. standard deviation, variance, quartile range or the like) representing dispersion of the actually measured output variable values. In such a case, the first or second partial error may be a value calculated by normalizing, by using the indicator value for a first input variable value set, a difference between the calculated output variable value for the first input variable value set and the actually measured output variable set for the first input variable value set. The value calculated by normalizing may include evaluation so as to ignore the error less than the standard deviation or evaluation by a ratio to the standard deviation. In addition, in such a case, the first or second entire error may be a value calculated by adding a square of the first or second partial error for all of the input variable value sets and dividing the added squares by the number of input variable value sets, or a value calculated by $1-\exp\{-(\text{a value calculated by adding a square of the first or second partial error for all of the input variable value sets and dividing the added squares by the number of input variable value sets})\}$. As for the entire error, the value of the former may become a very large value. Therefore, in such a case, the latter may be adopted to appropriately evaluate the entire error.

Further specifically, the aforementioned indicator value may be a standard deviation. In such a case, the aforementioned first or second partial error may be a greater value among a value calculated by (|the calculated output variable value−the actually measured output variable value|−the standard deviation) and 0. Furthermore, the aforementioned first or second entire error may be a value calculated by adding a square of the first or second partial error for all of the input variable value sets and dividing the added squares by the number of input variable value sets. Thus, the partial error to ignore the error less than the standard deviation may be adopted.

In addition, when the aforementioned indicator value is a standard deviation, the aforementioned first or second partial error may be a value calculated by (|the calculated output variable value−the actually measured output variable value|/the standard deviation). In this case, the aforementioned first or second entire error may be a value calculated by adding a square of the first or second partial error for all of the input variable value sets and dividing the added squares by the number of input variable value sets. Thus, the root mean square of the partial error normalized by the ratio to the standard deviation may be adopted as the entire error.

Furthermore, when the aforementioned indicator value is a standard deviation, the aforementioned first or second partial error may be a value calculated by (|the calculated output variable value−the actually measured output variable value|/the standard deviation). Furthermore, the aforementioned first or second entire error may be a value calculated by $1-\exp\{-(\text{a value calculated by adding a square of the first or second partial error for all of the input variable value sets and dividing the added squares by a number of input variable value sets})\}$. Thus, even when the partial error becomes a large value, the entire error can be appropriately evaluated.

Further specifically, the aforementioned indicator value may be a standard deviation, the aforementioned input variable value set may include a gate length, a gate width and a voltage value, and the aforementioned output variable value may be an electric current value. Then, the aforementioned first or second partial error may be a greater value among a value calculated by (|a calculated electric current value−an actually measured electric current value|−the standard deviation) and 0, for a certain combination of the gate length, the gate width and the voltage value. Furthermore, the aforementioned first or second entire error may be a value calculated by adding, with respect to all combinations of the gate length and the gate width, a third value calculated by adding, with respect to all of the voltage values, a square of the first or second partial error for a first combination of the gate length and the gate width and dividing the added squares by the number of voltage values, and dividing the added third values by the number of combinations of the gate length and the gate width.

In addition, as another specific example, the aforementioned indicator value may be a standard deviation, the aforementioned input variable value set may include a gate length, a gate width and a voltage value, and the aforementioned output variable value may be an electric current value. In such a case, the aforementioned first or second partial error may be a value calculated by (|a calculated electric current value−an actually measured electric current value|/the standard deviation) for a certain combination of the gate length, the gate width and the voltage value. Moreover, the aforementioned first or second entire error may be a value calculated by adding, with respect to all combinations of the gate length and the gate width, a third value calculated by adding, with respect to all of the voltage values, a square of the first or second partial error for a first combination of the gate length and the gate width and dividing the added squares by the number of voltage values, and dividing the added third values by the number of combinations of the gate length and the gate width.

Moreover, as still another specific example, the aforementioned indicator value may be a standard deviation, the aforementioned input variable value set may include a gate length, a gate width and a voltage value, and the aforementioned output variable value may be an electric current value. In such a case, the aforementioned first or second partial error may be a value calculated by (|a calculated electric current value−an actually measured electric current value|/the standard deviation) for a certain combination of the gate length, the gate width and the voltage value. In addition, the aforementioned first or second entire error may be a value calculated by adding, with respect to all combinations of the gate length and the gate width, a value calculated by (1−exp{−(a value calculated by adding a square of the first or second partial error for all of the voltage values and dividing the added squares by the number of voltage values)}) for a first combination of the gate length and the gate width, and dividing the added values by the number of combinations of the gate length and the gate width.

Furthermore, the aforementioned indicator value may be a value representing density of the input variable value sets in an input variable space, which are set according to the degree of the dispersion of the actually measured output variable values. In such a case, the aforementioned first or second partial error may be a second difference between the calculated output variable value for a second input variable value set and the actually measured output variable value for the second input variable value set. In addition, the aforementioned first or second entire error may be a value calculated by adding, with respect to all of the input variable value sets, the second difference for the corresponding input variable set while weighting by using the indicator value for the corresponding input variable value set and dividing the added second differences by the number of input variable value sets.

By using the characteristic of the setting method of the input variable value sets, it becomes possible to evaluate the error indirectly according to the dispersion of the actual measurement value. Then, it becomes possible to identify an appropriate input parameter value set, finally.

More specifically, the input variable value set may include a gate length, a gate width and a voltage value, and the aforementioned output variable value may be an electric current value. Then, the aforementioned indicator value may be an area of a largest rectangle including only a corresponding point, wherein the area is calculated for each of points corresponding to combinations of the gate length and the gate width in a plane mapped by a first axis representing a logarithmic value of the gate length and a second axis representing a logarithmic value of the gate width. In such a case, the aforementioned first or second partial error may be a value calculated by adding, with respect to all of the voltage values, a square of |a calculated electric current value−an actually measured electric current value| for a certain combination of the gate length, the gate width and the voltage value, and dividing the added squares by a number of voltage values. The aforementioned first or second entire error may be a value calculated by weighting the first or second partial error by the indicator value for a corresponding combination of the gate length and the gate width, adding, with respect to all of combinations of the gate length and the gate width, the weighted first or second partial error and dividing the added and weighted first or second partial errors by the number of combinations of the gate length and the gate width.

In another specific example, the aforementioned input variable value set may include a gate length, a gate width and a voltage value, and the output variable value may be an electric current value. Then, the aforementioned indicator value may be an inverse of the number of points included in a rectangle having, as a center, a certain point among points, which correspond to combinations of the gate length and the gate width and are arranged in a plane mapped by a first axis representing a logarithmic value of the gate length and a second axis representing a logarithmic value of the gate width. In such a case, the aforementioned first or second partial error may be a value calculated by adding, with respect to all of the voltage values, a square of |a calculated electric current value−an actually measured electric current value| for a certain combination of the gate length, the gate width and the voltage value, and dividing the added squares by the number of voltage values. Furthermore, the aforementioned first or second entire error may be a value calculated by weighting the first or second partial error by the indicator value for a corresponding combination of the gate length and the gate width, adding, with respect to all of combinations of the gate length and the gate width, the weighted first or second partial error and dividing the added and weighted first or second partial errors by the number of combinations of the gate length and the gate width.

Figure 48:
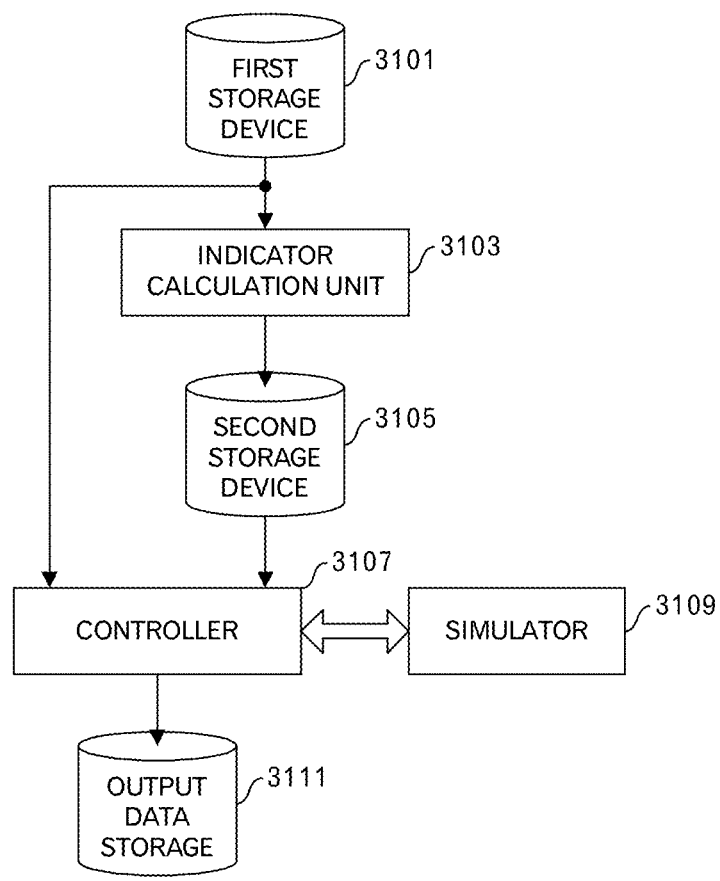
FIG. 48 is a functional block diagram of an apparatus in the embodiments.

In addition, this input parameter value set identifying apparatus (FIG. 48) includes (A) a first storage device (FIG. 48: 3101) storing, for each of input variable value sets, actually measured output variable values; (B) an indicator calculation unit (FIG. 48: 3103) to calculate, for each of said input variable value sets, which are set in advance, an indicator value associated with dispersion of the actually measured output variable values from data stored in said first storage device, and store the calculated indicator value into a second storage device (FIG. 48: 3105); and (B) a controller (FIG. 48: 3107) to repeat (1) a processing to cause a simulator (FIG. 48: 3109) for computing a calculated output variable value that is a calculated value of an output variable from a certain input parameter value set and a certain input variable value set to compute a calculated output variable value for each combination of one of candidate input parameter value sets and one of the input variable value sets, and (2) a processing to calculate, for each of said candidate input parameter value sets, a first entire error that is a result obtained by taking into consideration, with respect to all of the input variable value sets, first partial errors obtained respectively by evaluating, by using the indicator value for a corresponding input variable value set, which is stored in the second storage device, a difference between the calculated output variable value and the actually measured output variable value for the corresponding input variable value set, which is stored in said first storage device, or a second entire error that is a result obtained by taking into consideration, with respect to all of the input variable value sets, second partial errors, each of which is the difference, while weighting by using the indicator value for the corresponding input variable value set; and wherein said controller identifies the candidate input parameter value set making the first or second entire error minimum, and stores the identified candidate input parameter value set into an output data storage device (FIG. 48: 3111).

Incidentally, it is possible to create a program causing a computer to execute the aforementioned processing, and such a program is stored in a non-transitory computer readable storage medium or storage device such as a flexible disk, CD-ROM, DVD-ROM, magneto-optic disk, a semiconductor memory, and hard disk. In addition, the intermediate processing result is temporarily stored in a storage device such as a main memory or the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A non-transitory computer-readable storage medium storing a program for causing a computer to execute an input parameter value set identifying process, comprising:

calculating, for each of input variable value sets, which are set in advance, an indicator value that is a standard deviation of actually measured output variable values from data stored in a first storage device, and storing the calculated indicator value into a second storage device, wherein said first storage device stores, for each of said input variable value sets, the actually measured output variable values;

repeating a processing to cause a simulator for computing a calculated output variable value that is a calculated value of an output variable from a certain input parameter value set and a certain input variable value set to compute a calculated output variable value for each combination of one of candidate input parameter value sets and one of said input variable value sets, and a processing to calculate, for each of said candidate input parameter value sets, a first entire error that is a result obtained by taking into consideration, with respect to all of the input variable value sets, first partial errors obtained respectively by evaluating, by using the indicator value for a corresponding input variable value set, which is stored in the second storage device, a difference between the calculated output variable value and the actually measured output variable value for the corresponding input variable value set, which is stored in said first storage device, or a second entire error that is a result obtained by taking into consideration, with respect to all of the input variable value sets, second partial errors, each of which is said difference, while weighting by using the indicator value for the corresponding input variable value set;

identifying the candidate input parameter value set making the first or second entire error minimum, and storing the identified candidate input parameter value set into an output data storage device.

2. The non-transitory computer-readable storage medium as set forth in claim 1, wherein said first or second partial error is a value calculated by normalizing, by using said indicator value for a first input variable value set, a difference between the calculated output variable value for the first input variable value set and the actually measured output variable set for the first input variable value set, and said first or second entire error is a value calculated by adding a square of said first or second partial error for all of said input variable value sets and dividing the added squares by a number of input variable value sets, or a value calculated by 1−exp{−(a value calculated by adding a square of said first or second partial error for all of said input variable value sets and dividing the added squares by a number of input variable value sets)}.

3. The non-transitory computer-readable storage medium as set forth in claim 1, wherein said first or second partial error is a greater value among a value calculated by (|said calculated output variable value−said actually measured output variable value|−said standard deviation) and 0, and said first or second entire error is a value calculated by adding a square of said first or second partial error for all of said input variable value sets and dividing the added squares by a number of input variable value sets.

4. The non-transitory computer-readable storage medium as set forth in claim 1, wherein said first or second partial error is a value calculated by (|said calculated output variable value−said actually measured output variable value|/said standard deviation), and said first or second entire error is a value calculated by adding a square of said first or second partial error for all of said input variable value sets and dividing the added squares by a number of input variable value sets.

5. The non-transitory computer-readable storage medium as set forth in claim 1, wherein said first or second partial error is a value calculated by (|said calculated output variable value−said actually measured output variable value|/said standard deviation), and said first or second entire error is a value calculated by 1−exp{−(a value calculated by adding a square of said first or second partial error for all of said input variable value sets and dividing the added squares by a number of input variable value sets)}.

6. The non-transitory computer-readable storage medium as set forth in claim 1, wherein said input variable value set includes a gate length, a gate width and a voltage value, said output variable value is an electric current value, said first or second partial error is a greater value among a value calculated by (|a calculated electric current value−an actually measured electric current value|−said standard deviation) and 0, for a certain combination of said gate length, said gate width and said voltage value, and said first or second entire error is a value calculated by adding, with respect to all combinations of said gate length and said gate width, a third value calculated by adding, with respect to all of said voltage values, a square of said first or second partial error for a first combination of said gate length and said gate width and dividing the added squares by a number of voltage values, and dividing the added third values by a number of combinations of said gate length and said gate width.

7. The non-transitory computer-readable storage medium as set forth in claim 1, wherein said input variable value set includes a gate length, a gate width and a voltage value, said output variable value is an electric current value, said first or second partial error is a value calculated by (|a calculated electric current value−an actually measured electric current value|/said standard deviation) for a certain combination of said gate length, said gate width and said voltage value, and said first or second entire error is a value calculated by adding, with respect to all combinations of said gate length and said gate width, a third value calculated by adding, with respect to all of said voltage values, a square of said first or second partial error for a first combination of said gate length and said gate width and dividing the added squares by a number of voltage values, and dividing the added third values by a number of combinations of said gate length and said gate width.

8. The non-transitory computer-readable storage medium as set forth in claim 1, wherein said input variable value set includes a gate length, a gate width and a voltage value, said output variable value is an electric current value, said first or second partial error is a value calculated by (|a calculated electric current value−an actually measured electric current value|/said standard deviation) for a certain combination of said gate length, said gate width and said voltage value, and said first or second entire error is a value calculated by adding, with respect to all combinations of said gate length and said gate width, a value calculated by (1−exp{−(a value calculated by adding a square of said first or second partial error for all of the voltage values and dividing the added squares by a number of voltage values)}) for a first combination of said gate length and said gate width, and dividing the added values by a number of combinations of said gate length and said gate width.

9. An input parameter value set identifying method, comprising:

calculating, for each of input variable value sets, which are set in advance, an indicator value that is a standard deviation of actually measured output variable values from data stored in a first storage device, and storing the calculated indicator value into a second storage device, wherein said first storage device stores, for each of said input variable value sets, the actually measured output variable values;

repeating a processing to cause a simulator for computing a calculated output variable value that is a calculated value of an output variable from a certain input parameter value set and a certain input variable value set to compute a calculated output variable value for each combination of one of candidate input parameter value sets and one of said input variable value sets, and a processing to calculate, for each of said candidate input parameter value sets, a first entire error that is a result obtained by taking into consideration, with respect to all of the input variable value sets, first partial errors obtained respectively by evaluating, by using the indicator value for a corresponding input variable value set, which is stored in the second storage device, a difference between the calculated output variable value and the actually measured output variable value for the corresponding input variable value set, which is stored in said first storage device, or a second entire error that is a result obtained by taking into consideration, with respect to all of the input variable value sets, second partial errors, each of which is said difference, while weighting by using the indicator value for the corresponding input variable value set;

identifying the candidate input parameter value set making the first or second entire error minimum, and storing the identified candidate input parameter value set into an output data storage device.

10. An input parameter value set identifying apparatus, comprising:

a first storage device storing, for each of input variable value sets, actually measured output variable values;

an indicator calculation unit to calculate, for each of said input variable value sets, which are set in advance, an indicator value that is a standard deviation of the actually measured output variable values from data stored in said first storage device, and store the calculated indicator value into a second storage device; and a controller to repeat a processing to cause a simulator for computing a calculated output variable value that is a calculated value of an output variable from a certain input parameter value set and a certain input variable value set to compute a calculated output variable value for each combination of one of candidate input parameter value sets and one of said input variable value sets, and a processing to calculate, for each of said candidate input parameter value sets, a first entire error that is a result obtained by taking into consideration, with respect to all of the input variable value sets, first partial errors obtained respectively by evaluating, by using the indicator value for a corresponding input variable value set, which is stored in the second storage device, a difference between the calculated output variable value and the actually measured output variable value for the corresponding input variable value set, which is stored in said first storage device, or a second entire error that is a result obtained by taking into consideration, with respect to all of the input variable value sets, second partial errors, each of which is said difference, while weighting by using the indicator value for the corresponding input variable value set; and wherein said controller identifies the candidate input parameter value set making the first or second entire error minimum, and stores the identified candidate input parameter value set into an output data storage device.

11. An input parameter value set identifying apparatus, comprising:

a memory configured to store, for each of input variable value sets, actually measured output variable values; and a processor configured to execute a procedure, the procedure comprising:

calculating, for each of said input variable value sets, which are set in advance, an indicator value that is a standard deviation of the actually measured output variable values from data stored in said memory, and store the calculated indicator value into the memory; and repeating a processing to cause a simulator for computing a calculated output variable value that is a calculated value of an output variable from a certain input parameter value set and a certain input variable value set to compute a calculated output variable value for each combination of one of candidate input parameter value sets and one of said input variable value sets, and a processing to calculate, for each of said candidate input parameter value sets, a first entire error that is a result obtained by taking into consideration, with respect to all of the input variable value sets, first partial errors obtained respectively by evaluating, by using the indicator value for a corresponding input variable value set, which is stored in the memory, a difference between the calculated output variable value and the actually measured output variable value for the corresponding input variable value set, which is stored in said memory, or a second entire error that is a result obtained by taking into consideration, with respect to all of the input variable value sets, second partial errors, each of which is said difference, while weighting by using the indicator value for the corresponding input variable value set; and identifying the candidate input parameter value set making the first or second entire error minimum, and stores the identified candidate input parameter value set into the memory.

* * * * *